(12) United States Patent
Hong et al.

(10) Patent No.: US 11,157,120 B2
(45) Date of Patent: Oct. 26, 2021

(54) TOUCH SENSOR AND DISPLAY DEVICE INCLUDING THE TOUCH SENSOR

(71) Applicant: Samsung Display Co., Ltd., Yongin-si (KR)

(72) Inventors: Won Ki Hong, Yongin-si (KR); Tae Hee Lee, Yongin-si (KR); Rang Kyun Mok, Yongin-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 15/977,709

(22) Filed: May 11, 2018

(65) Prior Publication Data
US 2019/0004651 A1 Jan. 3, 2019

(30) Foreign Application Priority Data

Jun. 30, 2017 (KR) .................. 10-2017-0083676

(51) Int. Cl.
*G06F 3/044* (2006.01)
*G06F 3/041* (2006.01)
*H01L 27/32* (2006.01)

(52) U.S. Cl.
CPC .......... *G06F 3/0445* (2019.05); *G06F 3/0412* (2013.01); *G06F 3/0416* (2013.01);
(Continued)

(58) Field of Classification Search
CPC ....... G06F 3/0412; G06F 3/044; G06F 3/0416
See application file for complete search history.

(56) References Cited

U.S. PATENT DOCUMENTS

| 5,942,733 A | * | 8/1999 | Allen | G06K 9/00335 |
| | | | | 178/18.01 |
| 6,876,355 B1 | * | 4/2005 | Ahn | G02F 1/13394 |
| | | | | 345/173 |

(Continued)

FOREIGN PATENT DOCUMENTS

| JP | 2008-181438 | 8/2008 |
| KR | 10-2011-0050043 | 5/2011 |
| KR | 10-2017-0020621 | 2/2017 |

OTHER PUBLICATIONS

Jack Purcher, Patentlty Apple, "Samsung to introduce 3D Force Touch Virtual Home Button for the Galaxy S8 and win Orders from Apple for Similar Technology", Mar. 14, 2017, available at: http://www.patentlyapple.com/patently-apple/2017/03/samsung-to-introduce-3d-force-touch-virtual-home-button-for-the-galaxy-s8-and-win-orders-from-apple-for-similar-tech.html.

(Continued)

*Primary Examiner* — Nitin Patel
*Assistant Examiner* — Robert M Stone
(74) *Attorney, Agent, or Firm* — H.C. Park & Associates, PLC

(57) ABSTRACT

A display device according to an embodiment includes: a display panel including a plurality of pixels disposed in a display region; a pressure sensor disposed to overlap with the display panel, the pressure sensor including a plurality of sensor electrodes disposed in a touch region; a bump structure disposed on at least one of a first surface and a second surface of the pressure sensor to be separated from the sensor electrodes; and a housing supporting the display panel, the pressure sensor, and the bump structure. The bump structure includes a plurality of bumps distributed on respective coordinate points at which the sensor electrodes are disposed.

4 Claims, 21 Drawing Sheets

(52) U.S. Cl.
CPC .......... *G06F 3/0443* (2019.05); *G06F 3/0446* (2019.05); *H01L 27/323* (2013.01); *G06F 3/0447* (2019.05); *G06F 3/04144* (2019.05); *G06F 2203/04106* (2013.01)

(56) References Cited

U.S. PATENT DOCUMENTS

| | | | |
|---|---|---|---|
| 7,274,424 B1 * | 9/2007 | Kurihara | G02F 1/13338 |
| | | | 345/173 |
| 7,511,702 B2 | 3/2009 | Hotelling | |
| 7,538,760 B2 * | 5/2009 | Hotelling | G06F 3/0414 |
| | | | 178/18.06 |
| 7,956,939 B2 | 6/2011 | Kubota et al. | |
| 8,654,524 B2 | 2/2014 | Pence et al. | |
| 8,686,952 B2 | 4/2014 | Burrough et al. | |
| 8,787,006 B2 | 7/2014 | Golko et al. | |
| 9,195,354 B2 * | 11/2015 | Bulea | G06F 3/044 |
| 9,223,165 B2 * | 12/2015 | Nashiki | G06F 3/041 |
| 9,274,660 B2 | 3/2016 | Bernstein et al. | |
| 9,983,708 B2 * | 5/2018 | Iwata | B32B 27/06 |
| 10,275,072 B2 * | 4/2019 | Han | G06F 3/0488 |
| 2002/0094660 A1 * | 7/2002 | Getz | G06F 3/041 |
| | | | 438/455 |
| 2003/0087119 A1 * | 5/2003 | Iwabuchi | G06F 3/045 |
| | | | 428/633 |
| 2003/0234769 A1 * | 12/2003 | Cross | G06F 3/0412 |
| | | | 345/173 |
| 2006/0254369 A1 * | 11/2006 | Yoon | A61B 5/6804 |
| | | | 73/862.041 |
| 2006/0260417 A1 * | 11/2006 | Son | G01L 1/205 |
| | | | 73/862.046 |
| 2007/0236466 A1 * | 10/2007 | Hotelling | G06F 3/0414 |
| | | | 345/173 |
| 2008/0079697 A1 * | 4/2008 | Lee | G06F 3/045 |
| | | | 345/173 |
| 2008/0180585 A1 * | 7/2008 | Kubota | G06F 3/041 |
| | | | 349/12 |
| 2009/0033636 A1 * | 2/2009 | Toyota | G06F 3/044 |
| | | | 345/174 |
| 2009/0174832 A1 * | 7/2009 | Lee | G06F 3/045 |
| | | | 349/43 |
| 2010/0253651 A1 * | 10/2010 | Day | G06F 3/044 |
| | | | 345/175 |
| 2010/0289770 A1 * | 11/2010 | Lee | G06F 3/044 |
| | | | 345/174 |
| 2010/0304013 A1 * | 12/2010 | Wang | G06F 3/044 |
| | | | 427/58 |
| 2011/0115738 A1 * | 5/2011 | Suzuki | G01L 1/205 |
| | | | 345/173 |
| 2012/0299872 A1 * | 11/2012 | Nishikawa | G06F 3/045 |
| | | | 345/174 |
| 2013/0009653 A1 * | 1/2013 | Fukushima | G06F 3/0447 |
| | | | 324/679 |
| 2013/0100030 A1 * | 4/2013 | Los | G06F 3/023 |
| | | | 345/169 |
| 2013/0234734 A1 * | 9/2013 | Lida | G01R 27/2605 |
| | | | 324/661 |
| 2014/0028575 A1 | 1/2014 | Parivar et al. | |
| 2014/0043289 A1 * | 2/2014 | Stern | G06F 3/044 |
| | | | 345/174 |
| 2014/0085213 A1 | 3/2014 | Huppi et al. | |
| 2014/0091857 A1 | 4/2014 | Bernstein | |
| 2014/0092064 A1 | 4/2014 | Bernstein et al. | |
| 2014/0293145 A1 | 10/2014 | Jones et al. | |
| 2015/0277626 A1 * | 10/2015 | Shinkai | G06F 3/044 |
| | | | 345/174 |
| 2015/0363023 A1 * | 12/2015 | Kawaguchi | G06F 3/044 |
| | | | 345/174 |
| 2016/0062517 A1 | 3/2016 | Meyer et al. | |
| 2016/0179248 A1 * | 6/2016 | Nishimura | G06F 3/044 |
| | | | 345/174 |
| 2016/0202800 A1 * | 7/2016 | Itaya | G06F 3/044 |
| | | | 345/174 |
| 2016/0274724 A1 * | 9/2016 | Chang | G06F 3/0416 |
| 2016/0283007 A1 * | 9/2016 | Ogura | G06F 3/0414 |
| 2017/0115768 A1 * | 4/2017 | Shih | G06F 3/044 |
| 2017/0115792 A1 * | 4/2017 | Nishimura | G06F 3/0416 |
| 2017/0336891 A1 * | 11/2017 | Rosenberg | G06F 3/0421 |
| 2019/0346957 A1 * | 11/2019 | Hong | G06F 3/0414 |

OTHER PUBLICATIONS

Jose Ilbo, "Is 3D Touch Thin Film for AMOLED the Main Culprit in Price Rise of iPhone 8?", Mar. 15, 2017, available at http://www.joseilbo.com/news/htmls/2017/03/20170315319132.html.

K Bench, "OLED 'iPhone 8' Launch above $1,000 . . . Manufacturing Cost for 3D Touch Module Soars 60%", Mar. 15, 2017, available at http://www.kbench.com/?q=node/173734.

Office Action dated May 17, 2021 in the Korean Patent Office for Korean Patent Application No. 10-2017-0083676.

* cited by examiner

FIG. 25A

| POSITION OF BUMP | no bump | Top | Top & Bottom |
|---|---|---|---|
| STRESS (Avg. Stress) | 13.2KPa | 16.4KPa | 19.9KPa |

FIG. 25B

| PITCH BETWEEN BUMPS | 3mm | 6mm |
|---|---|---|
| STRESS (Avg. Stress) | 19.9KPa | 31.0KPa |

FIG. 25C

| | no bump | APPLICATION OF BUMPS ON ONE SURFACE (PITCH BETWEEN BUMPS 3mm) | CHANGE IN PITCH BETWEEN BUMPS (3mm → 6mm) |
|---|---|---|---|
| STRESS (Avg. Stress) | 13.2KPa | 16.4KPa | 25.4KPa |
| SENSITIVITY MEASUREMENT VALUE | 51.7gf | 44.2gf | 30gf |

TOUCH SENSOR AND DISPLAY DEVICE INCLUDING THE TOUCH SENSOR

CROSS-REFERENCE TO RELATED APPLICATION

This application claims priority from and the benefit of Korean Patent Application No. 10-2017-0083676, filed on Jun. 30, 2017, which is hereby incorporated by reference for all purposes as if fully set forth herein.

BACKGROUND

Field

Exemplary embodiments relate to a touch sensor and a display device including the touch sensor.

Discussion of the Background

A touch sensor is an input device, and is often provided in a display device. A user presses or touches the touch sensor while viewing an image displayed on a screen of the display device, so that a desired input can be conveniently provided.

There have been increasing demands for a touch sensor capable of sensing not only a position at which a touch input is generated, but also a pressure generated due to the touch input. If a touch pressure is sensed as well as a touch position, various functions can be provided to a user.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a touch sensor capable of sensing a touch pressure with high sensitivity and a display device including the touch sensor.

Additional aspects will be set forth in the detailed description which follows, and, in part, will be apparent from the disclosure, or may be learned by practice of the inventive concept.

According to exemplary embodiments, a display device includes: a display panel including a plurality of pixels disposed in a display region; a pressure sensor disposed to overlap with the display panel, the pressure sensor including a plurality of sensor electrodes disposed in a touch region; a bump structure disposed on at least one of a first surface and a second surface of the pressure sensor to be separated from the sensor electrodes; and a housing supporting the display panel, the pressure sensor, and the bump structure, wherein the bump structure includes a plurality of bumps distributed on respective coordinate points at which the sensor electrodes are disposed.

The pressure sensor and the bump structure may be disposed between the display panel and the housing.

The plurality of bumps may include at least one of a plurality of first bumps disposed on the second surface of the pressure sensor, and a plurality of second bumps disposed on the first surface of the pressure sensor.

The display device may further comprise a bump body disposed on bottom surfaces of the plurality of first bumps, and the bump body may integrally connect the plurality of first bumps to each other.

The first bumps may be disposed to be separated from each other, and the display device may further include a supporting layer disposed between the first bumps and the housing.

At least one of the first bumps and the second bumps may be made of a conductive material.

The pressure sensor may be disposed on the top of the display panel.

The bump structure may include a plurality of first bumps disposed between the pressure sensor and the display panel.

The display device may further include a polarizing layer disposed between the display panel and the pressure sensor.

The first bumps may be integrally configured with the polarizing layer and protrude in a thickness direction from a first surface of the polarizing layer.

The display device may further include a window disposed on the top of the pressure sensor.

The bump structure may include a plurality of second bumps integrally configured with the window, the plurality of second bumps protruding in a thickness direction from a surface of the window.

The bump structure may include a plurality of first bumps integrally configured with the display panel, the plurality of first bumps protruding in a thickness direction from a first surface of the display panel.

The display device may further include a polarizing layer disposed on the top of the pressure sensor.

The bump structure may include a plurality of second bumps integrally configured with the polarizing layer, the plurality of second bumps protruding in a thickness direction from a second surface of the polarizing layer.

The display device may further include a pressure sensitive adhesive layer disposed on at least one of first and second surfaces of the bumps.

The pressure sensor may include at least one of an elastic layer, a piezoelectric layer, a pressure sensitive layer, and a deformation sensitive layer.

The sensor electrodes may include: a plurality of first sensor electrodes arranged along a first direction, the plurality of first sensor electrodes each extending in a second direction intersecting the first direction; and a plurality of second sensor electrodes arranged along the second direction, the plurality of second sensor electrodes each extending in the first direction. The bumps may be distributed on respective intersection portions at which the first sensor electrodes and the second sensor electrodes intersect each other.

The bump structure may include a pair of first and second bumps located on each of the intersection portions to overlap with each other, the pair of first and second bumps being respectively disposed on the second surface and the first surface of the pressure sensor.

The first bump may have a width equal to or wider than that of the intersection portion, and the second bump may have a width smaller than that of the intersection portion.

The sensor electrodes may be disposed at positions corresponding to the respective coordinate points to be separated from each other, and the bumps may be disposed to overlap with the sensor electrodes, respectively.

The bump structure may include at least one of a plurality of first bumps disposed on the second surface of the pressure sensor, the plurality of first bumps having an area equal to or larger than that of each of the sensor electrodes, and a plurality of second bumps disposed on the first surface of the pressure sensor, the plurality of second bumps having an area smaller than that of each of the sensor electrodes.

The pressure sensor and the bump structure may constitute a first touch sensor, and the display device may further include a second touch sensor separated from the first touch sensor with at least the display panel interposed therebetween.

The first touch sensor may be disposed between the display panel and the housing, and the second touch sensor may be disposed on the top of the display panel.

The display device may further include a window disposed on the top of the second touch sensor.

According to another exemplary embodiment, a touch sensor includes: a pressure sensor having a sensor electrode disposed in a touch region; a first bump disposed on one surface of the pressure sensor, the first bump being located on one coordinate point defined on the touch region; and a second bump disposed on the other surface of the pressure sensor, the second bump being located on the coordinate point to overlap with the first bump with the pressure sensor interposed therebetween.

The foregoing general description and the following detailed description are exemplary and explanatory, and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 7 shows an intersection portion of a first sensor electrode and a second sensor electrode.

FIG. 9 shows the intersection portion of the first sensor electrode and the second sensor electrode.

FIG. 10 shows the intersection portion of the first sensor electrode and the second sensor electrode.

FIGS. 25A, 25B, and 25C illustrate changes in stress and sensitivity depending on the presence of bumps, positions of the bumps, and a pitch between the bumps.

DETAILED DESCRIPTION OF THE ILLUSTRATED EMBODIMENTS

Figure 1:
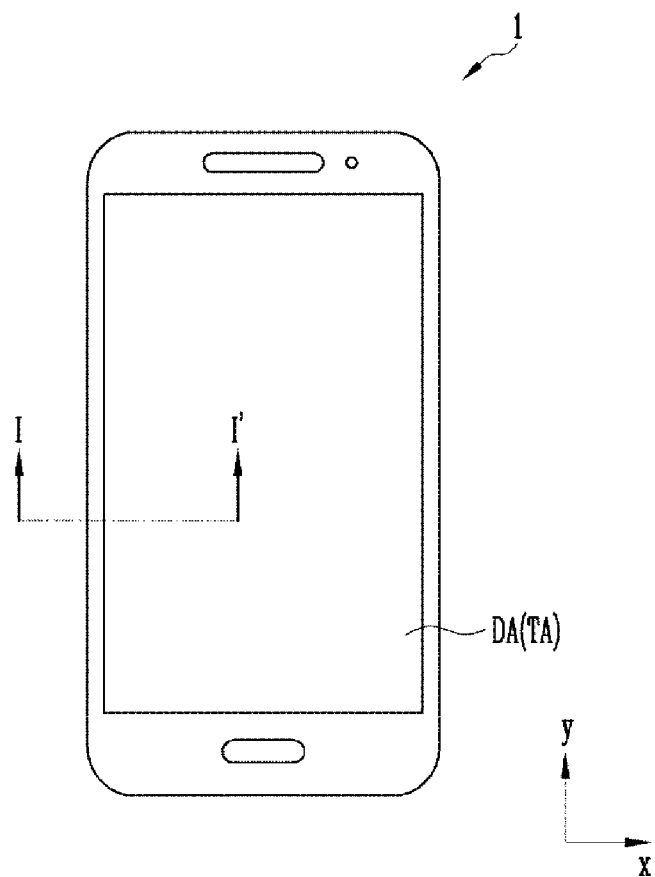
FIG. 1 illustrates a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the spirit and the scope of the disclosure.

In the accompanying figures, the size and relative sizes of layers, films, panels, regions, etc., may be exaggerated for clarity and descriptive purposes. Also, like reference numerals denote like elements.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various exemplary embodiments may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading necessarily conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings.

Spatially relative terms, such as "beneath," "below," "lower," "above," "upper," "over," "higher," "side" (e.g., as in "sidewall"), and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, portions of some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the spirit and scope of the inventive concepts. Further, the blocks, units, and/or modules of some exemplary embodiments may be physically combined into more complex blocks, units, and/or modules without departing from the spirit and scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
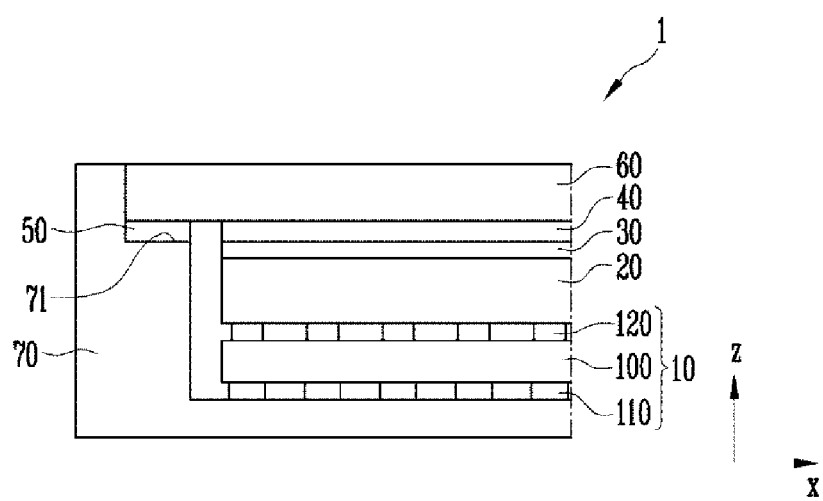
FIGS. 2A and 2B illustrate examples of a section taken along line I-I' of FIG. 1.
Figure 2B:
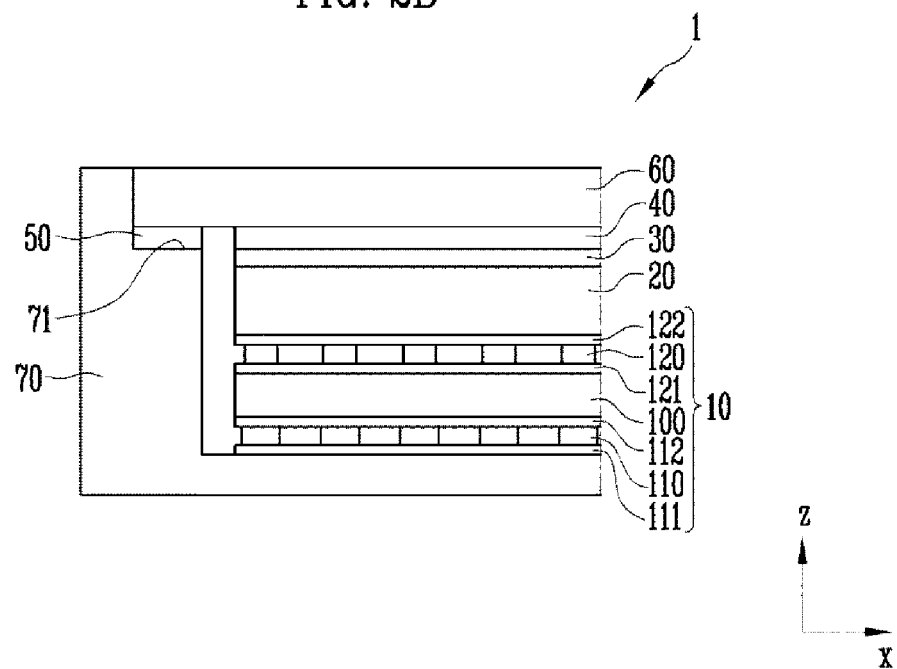

FIG. 1 illustrates a display device according to an exemplary embodiment. FIGS. 2A and 2B illustrate examples of a section taken along line I-I' of FIG. 1. For convenience, in FIGS. 1, 2A, and 2B, a portable display device is illustrated as an example of the display device, but the display device according to the inventive concepts is not limited thereto.

Referring to FIGS. 1, 2A, and 2B, the display device 1 according to the exemplary embodiment includes a touch sensor 10, a display panel 20, a window 60, and a housing (or a bracket) 70.

The touch sensor 10 senses a position of a touch input provided in a touch region TA and a pressure according to the touch input. In this example, the touch sensor 10 includes at least a pressure sensor 100. In some exemplary embodiments, the pressure sensor 100 may include a pressure sensitive device including a pressure sensitive material or pressure sensitive resistor, a deformation sensitive device including a strain gauge, a piezo-resistive device or piezo-electric device, and a gap capacitance sensitive device. In addition, the pressure sensor 100 may include various pressure sensitive devices capable of sensing a pressure applied from the outside. The kind of the pressure sensor 100 is not particularly limited. The pressure sensor 100 may have or may not have flexibility. That is, the pressure sensor 100 may be a flexible sensor or rigid sensor, and the material or property of the pressure sensor 100 is not particularly limited.

Also, the touch sensor 10 according to the exemplary embodiment may include a bump structure, and the bump structure may include a plurality of first bumps 110 and/or a plurality of second bumps 120 for concentrating a pressure caused by a touch input on an effective point of the pressure sensor 100.

In some exemplary embodiments, the bump structure may be provided on at least one surface (e.g., one or more outer surfaces) of the pressure sensor 100. For example, the first bumps 110 and/or the second bumps 120 may be provided or otherwise disposed on at least one of upper and lower surfaces (also referred to as first and second surfaces) of the pressure sensor 100. The upper surface (the first surface) may be a front or top surface of the pressure sensor 100, and the lower surface (the second surface) may be a rear or bottom surface of the pressure sensor 100. The front or top surface may be a surface arranged in a direction in which an image is displayed or viewed. In an exemplary embodiment, the bump structure may include at least one of the plurality of first bumps 110 provided on the lower surface (i.e., the second surface) of the pressure sensor 100 and the plurality of second bumps 120 provided on the upper surface (i.e., the first surface) of the pressure sensor 100.

The first and/or second bumps 110 and 120 may be made of a flexible or rigid material, and be made of a material that has or does not have elasticity. Also, the first and/or second bumps 110 and 120 may be made of a conductive or non-conductive material. That is, the material or property of the first and/or second bumps 110 and 120 is not particularly limited. Therefore, the material, thickness, etc. of the first and/or second bumps 110 and 120 may be selected by considering mechanical characteristics corresponding to design conditions of the display device 1.

When a specific additional function is to be added to the first and/or second bumps 110 and 120 in addition to the object of concentrating the pressure, the material, etc. of the first and/or second bumps 110 and 120 may be selected according to a desired function. For example, as at least some of the first and/or second bumps 110 and 120 are made of a conductive material, an electromagnetic interference (EMI) shielding layer may be formed. In an exemplary embodiment, as the second bumps 120 provided between the pressure sensor 100 and the display panel 20 are made of a conductive pressure sensitive adhesive including a conductive material such as copper (Cu), the second bumps 120 may be integrally formed with the EMI shielding layer. In some exemplary embodiments, as the first and/or second bumps 110 and 120 are formed with a driver device such as an actuator, the display device 1 may have more various functions.

In some exemplary embodiments, the first and/or second bumps 110 and 120 may be provided on the outer surfaces to be separated from sensor electrodes included in the pressure sensor 100. Accordingly, the first and/or second bumps 110 and 120 are insulated from the sensor electrodes. Thus, even when at least some of the first and/or second bumps 110 and 120 have conductivity, a pressure concentration effect can be provided while preventing the occurrence of noise, caused by the first and/or second bumps 110 and 120 constituting the bump structure. An example of the structure and arrangement of the first and/or second bumps 110 and 120 and the sensor electrodes will be described in detail later.

In some exemplary embodiments, an adhesive layer may be provided on at least one of upper and lower surfaces (e.g., a front or top surface and/or a rear or bottom surface) of the first and/or second bumps 110 and 120. For example, as shown in FIG. 2B, pressure sensitive adhesive layers 111, 112, 121, and 122 may be provided on the upper and lower surfaces of the first bumps 110 and the upper and lower surfaces of the second bumps 120.

The display panel 20 displays an image through a display region DA in which a plurality of pixel are provided. The display panel 20 may have or may not have flexibility. That is, the display panel 20 may be a flexible display panel or rigid display panel, and the material of the display panel 20 is not particularly limited.

In some exemplary embodiments, the display panel 20 may be provided to overlap with the touch sensor 10. That is, the display panel 20 may overlap with the pressure sensor 100 and the first and/or second bumps 110 and 120. In an exemplary embodiment, the display panel 20 may be disposed on the top of the touch sensor 10. However, exemplary embodiments are not limited thereto, and the positions of the display panel 20 and the touch sensor 10 may be changed.

In addition, the display region DA of the display panel 20 may correspond to the touch region TA, but exemplary embodiments are not limited thereto. For example, in another exemplary embodiment, only a partial region of the display region DA may be designated as the touch region TA, or the display region DA and the touch region TA may be separated from each other.

In some exemplary embodiments, the window 60 may be provided on the top of the display panel 20. The window 60 may have or may not have flexibility. For example, the window 60 may be a flexible window or rigid window, and the material or property of the window 60 is not particularly limited. Also, the window 60 is provided at an image display surface (e.g., an upper surface or a front or top surface) of the display panel 20, and may be substantially transparent such that light from the display panel 20 can be transmitted therethrough. In the description of the exemplary embodiment, the term "substantially transparent" may inclusively mean "transparent" or "translucent" to an extent to satisfy transparency in a predetermined range.

A polarizing layer 30 may be provided between the display panel 20 and the window 60. The polarizing layer 30 may be provided at one (e.g., the upper, front or top surface) of the surfaces of the display panel 20, on which an image is displayed. Meanwhile, in some exemplary embodiments, the polarizing layer 30 may be omitted.

In some exemplary embodiments, a first adhesive layer 40 may be provided between the display panel 20 and the window 60, for example, between the polarizing layer 30 and the window 60. That is, the window 60 may be coupled to the display panel 20 (or the display panel 20 and the polarizing layer 30) through the first adhesive layer 40. Meanwhile, in some exemplary embodiments, the window 60 may be omitted. For example, in another exemplary embodiment, the window 60 may be integrally formed with the display panel 20 and/or the polarizing layer 30.

The housing 70 may support and/or accommodate the touch sensor 10, the display panel 20, and the like therein. In an exemplary embodiment, the housing 70 may sequentially accommodate the touch sensor 10, the display panel 20, and the window 60 from a bottom surface thereof.

Also, the housing 70 may include a sidewall that surrounds side surfaces of the touch sensor 10, the display panel 20, and the window 60. In some exemplary embodiments, a stepped part 71 corresponding to an edge region of the window 60 may be provided at the sidewall, and the window 60 may be coupled to the housing 70 through a second adhesive layer 50 provided on the stepped part 71. In some exemplary embodiments, the first and second adhesive layers 40 and 50 may be formed with an optically transparent adhesive, other resins, a tape, etc. Also, in some exemplary embodiments, at least one of the first and second adhesive layers 40 and 50 may have a waterproof function. In an exemplary embodiment, the second adhesive layer 50 may be a waterproof tape.

Figure 3:
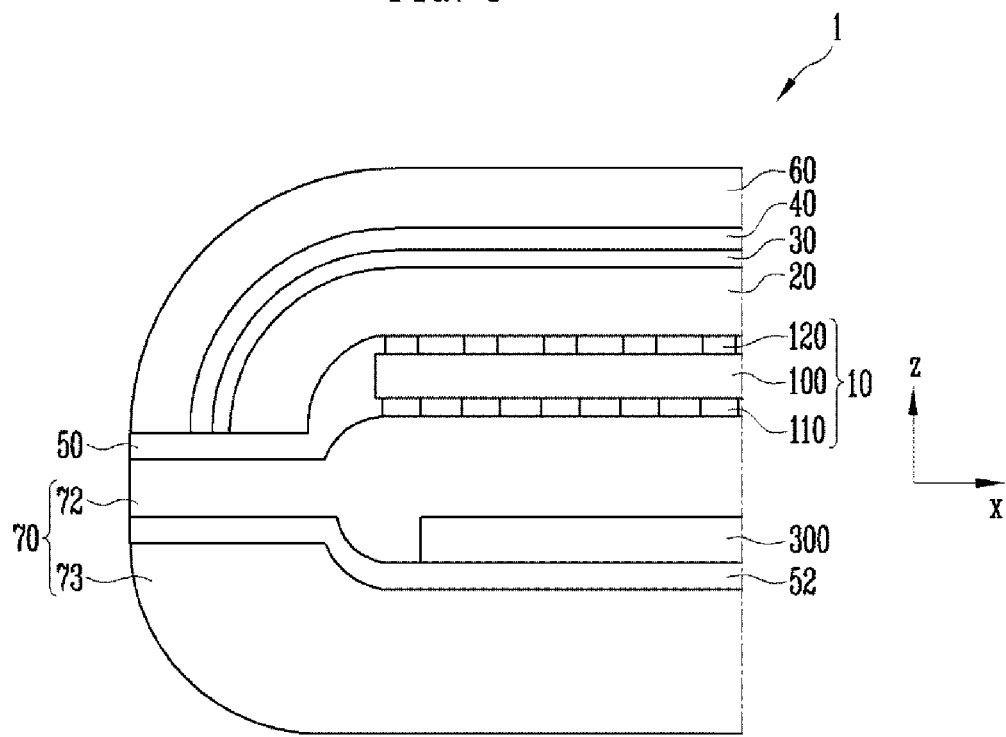
FIG. 3 illustrates an example of a section of a display device according to another exemplary embodiment.

FIG. 3 illustrates an example of a section of a display device according to another exemplary embodiment. In FIG. 3, components similar or identical to those of FIGS. 1 to 2B are designated with like reference numerals, and their detailed descriptions will be omitted.

Referring to FIG. 3, in some exemplary embodiments, each of the display panel 20 and the window 60 may have a curved surface or inclined surface in at least one region. In an exemplary embodiment, each of the display panel 20 and the window 60 may have a curved surface or inclined surface formed in a shape in which at least one edge region (e.g., left/right edge regions) is curved or inclined in the lower direction (e.g., the rear or bottom direction). In some exemplary embodiments, the display panel 20 and the window 60 may be coupled to the housing 70 through the second adhesive layer 50.

In some exemplary embodiments, the housing 70 may include a plurality of sub-housings. In an exemplary embodiment, the housing 70 may include a first sub-housing 72 and a second sub-housing 73, which are coupled to each other through a third adhesive layer 52. In some exemplary embodiments, the first and second sub-housings 72 and 73 may be configured as a middle frame and a back cover, respectively. In some exemplary embodiments, various parts 300 such as a battery, a printed circuit board, and/or a circuit device may be located between the first and second sub-housings 72 and 73.

In some exemplary embodiments, the second and third adhesive layers 50 and 52 may have a waterproof function. In an exemplary embodiment, the second and third adhesive layers 50 and 52 may be configured as waterproof tapes, to prevent water or moisture from penetrating into the display device 1.

Figure 4:
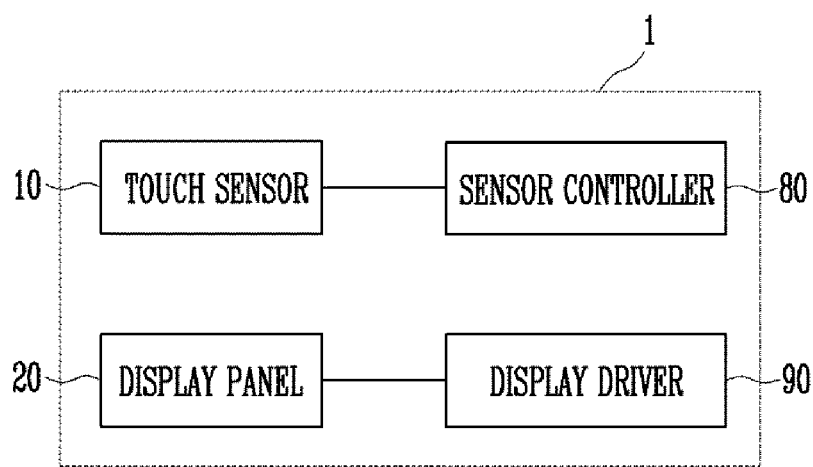
FIG. 4 illustrates a configuration of a display device according to an exemplary embodiment.

FIG. 4 illustrates a configuration of a display device according to an exemplary embodiment. In FIG. 4, components similar or identical to those of FIGS. 1 to 3 are designated by like reference numerals, and their detailed descriptions will be omitted.

Referring to FIG. 4, the display device 1 according to the exemplary embodiment may further include a sensor controller 80 and a display driver 90, in addition to the touch sensor 10 and the display panel 20.

The sensor controller 80 may be electrically connected to the touch sensor 10, detect a touch input by using a sensing signal generated from touch sensor 10. In an exemplary embodiment, the sensor controller 80 may detect a touch input by receiving a sensing signal generated from the touch sensor 10 while supplying, to the touch sensor 10, a signal required to drive the touch sensor 10. For example, the sensor controller 80 may detect a position of a touch input and an intensity of a pressure caused by the touch input by analyzing a sensing signal generated from the touch sensor 10.

The display driver 90 may be electrically connected to the display panel 20 to supply a signal required to drive the display panel 20. In an exemplary embodiment, the display driver 90 may include at least one of a scan driver, a data driver, and a timing controller, which drive the display panel 20. In some exemplary embodiments, the display driver 90 may be provided at the outside of the display panel 20, or at least a portion of the display driver 90 may be integrated on the display panel 20.

In some exemplary embodiments, the sensor controller 80 and the display driver 90 along with the touch sensor 10 and the display panel 20 may be accommodated at the inside (or an upper, front or top portion) of the above-described housing 70 and supported by the housing 70. In an exemplary embodiment, the sensor controller 80 and the display driver 90 may be integrated on a printed circuit board to be disposed on the bottom surface of the housing 70 (or the second sub-housing 73), or be disposed at the inside of the housing 70 to be adjacent to the sidewall of the housing 70.

Figure 5:
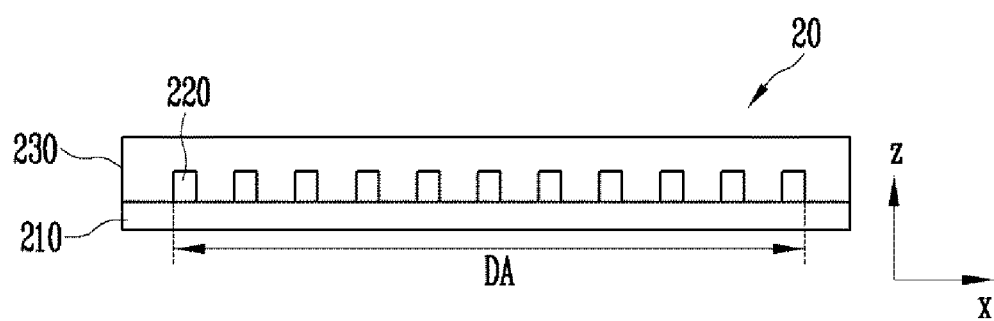
FIG. 5 illustrates a display panel according to an exemplary embodiment.

FIG. 5 illustrates a display panel according to an exemplary embodiment.

Referring to FIG. 5, the display panel 20 according to the exemplary embodiment may include first and second display substrates 210 and 230, and pixels 220 provided between the first and second display substrates 210 and 230. Meanwhile, in the description of the exemplary embodiments, the term "substrate" may not only mean a glass substrate and/or a synthetic resin film substrate but also mean an insulating layer formed on a predetermined base substrate. That is, as used herein, the term "substrate" may mean not only a general substrate but also an insulating layer including one or more layer, and be construed as a comprehensive meaning. In an exemplary embodiment, the first display substrate 210 may be a glass substrate or film substrate, and the second display substrate 230 may be an encapsulation layer including at least one insulating layer. In addition, the materials or structures of the first and second display substrates 210 and 230 may be variously changed.

The first display substrate 210 may be made of an insulative material such as glass or resin, and have a single- or multi-layered structure. Also, the first display substrate 210 may be a flexible substrate having flexibility to be bendable or foldable or a rigid substrate that is relatively rigid. That is, the material or property of the first display substrate 210 is not particularly limited.

In an exemplary embodiment, the first display substrate 210 may be a rigid substrate configured with glass or tempered glass or a flexible substrate configured with a thin film made of a flexible plastic material. For example, the first display substrate 210 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the first display substrate 210 may be variously changed. In an exemplary embodiment, the first display substrate 210 may be made of a fiber reinforced plastic (FRP), etc.

A plurality of pixels 220 may be provided on the first display substrate 210. The pixels 220 may be provided in a display region DA on the first display substrate 210. In some exemplary embodiments, each of the pixels 220 may include at least one light emitting device (e.g., an organic light emitting diode), but exemplary embodiments are not limited thereto. That is, the kind of the display panel 20 is not particularly limited.

The second display substrate 230 may be provided on one surface (e.g., an upper surface or a front or top surface) of the first display substrate 210 on which the pixels 220 are provided. The second display substrate 230 seals the display region DA, to prevent moisture or oxygen from penetrating into the pixels 220.

In some exemplary embodiments, the second display substrate 230 may be configured with a substrate made of a glass or film material and/or an insulating layer including one or more layers. In an exemplary embodiment, the second display substrate 230 may include at least one of glass, an organic material, and an inorganic material, and have a single- or multi-layered structure.

For example, the second display substrate 230 may have a multi-layered structure including at least one organic layer and at least one inorganic layer, or have a single-layered structure including an organic/inorganic hybrid material. The material of the organic layer may include organic insulating materials such as polyacryl, polyimide, fluorine-based compound such as Teflon, polyepoxy, and benzocyclobutene, but exemplary embodiments are not limited thereto. The material of the inorganic layer may include inorganic insulating materials such as polysiloxane, silicon nitride, silicon oxide, and metal oxide including aluminum oxide, but are not limited thereto.

Figure 6:
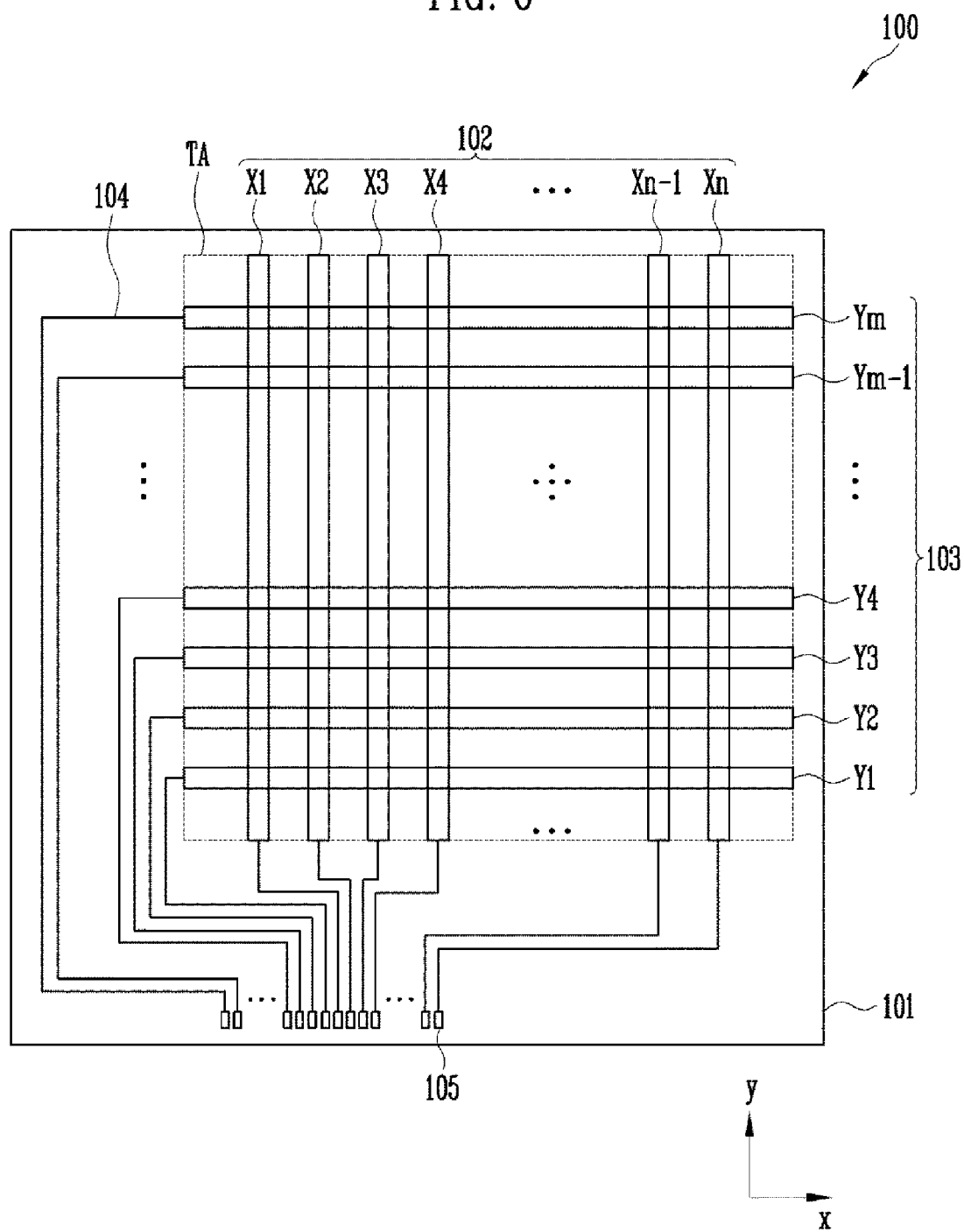
FIG. 6 illustrates a pressure sensor according to an exemplary embodiment.

FIG. 6 illustrates a pressure sensor according to an exemplary embodiment.

Referring to FIG. 6, the pressure sensor 100 according to the exemplary embodiment may include a first sensor substrate (or first substrate) 101 and a plurality of sensor electrodes 102 and 103 provided on the first sensor substrate 101. The sensor electrodes 102 and 103 may be provided in a touch region TA.

The first sensor substrate 101 may be made of an insulative material such as glass or resin, and have a single- or multi-layered structure. Also, the first sensor substrate 101 may be a flexible substrate or rigid substrate. In an exemplary embodiment, the first sensor substrate 101 may be made of at least one of the above-described materials mentioned as the material constituting the first display substrate 210 and/or the second display substrate 230. Also, the first sensor substrate 101 may be made of the same material as the first display substrate 210 and/or the second display substrate 230, or be made of a material different from that of the first display substrate 210 and/or the second display substrate 230. That is, the material or property of the first sensor substrate 101 is not particularly limited.

In some exemplary embodiments, the sensor electrodes 102 and 103 may include a plurality of first sensor electrodes 102 and a plurality of second sensor electrodes 103, which extend in different directions. The first sensor electrodes 102 and the second sensor electrodes 103 may intersect each other in the touch region TA. Meanwhile, in FIG. 6, each of the first and second sensor electrodes 102 and 103 are provided as bar-shaped electrodes that are connected integrally, but the shape of the first and second sensor electrodes 102 and 103 is not limited thereto. For example, each of at least some of the first and second sensor electrodes 102 and 103 may have a shape including a plurality of electrode parts arranged in one direction and a plurality of connection parts connecting the electrode parts.

Intersection portions (or intersection nodes) at which the first and second sensor electrodes 102 and 103 intersect each other may be configured as coordinate points on the touch region TA, respectively. That is, the coordinate points on the touch region TA may be defined by the first and second sensor electrodes 102 and 103, and each of the coordinate points may be an effective point used to detect a position of a touch input, etc. For example, when a touch input is provided in the touch region TA, a touch position may be detected by detecting a region in which the touch input is provided or at least a pair of first and second electrode 102 and 103 located around the region.

In some exemplary embodiments, the first sensor electrodes 102 may be arranged along a first direction, and each of the first sensor electrodes 102 may extend in a second direction intersecting the first direction. In an exemplary embodiment, the first sensor electrodes 102 may be configured as n electrodes X1 to Xn (n is a natural number) that are arranged at a predetermined distance along an x-axis direction and extend in a y-axis direction. In some exemplary embodiments, each of the first sensor electrodes 102 may be provided with a position along the first direction, i.e., an x coordinate.

In addition, the second sensor electrodes 103 may be arranged along the second direction, and each of the second sensor electrodes 103 may extend in the first direction. In an exemplary embodiment, the second sensor electrodes 103 may be configured as m electrodes Y1 to Ym (m is a natural number) that are arranged at a predetermined distance along the y-axis direction and extend in the x-axis direction. In some exemplary embodiments, each of the second sensor electrodes 103 may be provided with a position along the second direction, i.e., a y coordinate.

That is, coordinate points on the touch region A may be defined by the first and second sensor electrodes 102 and 103. For example, the coordinate points may be intersection portions at which the first and second sensor electrodes 102 and 103 intersect each other.

Each of the first and second sensor electrodes 102 and 103 may include a conductive material. Also, each of the first and second sensor electrodes 102 and 103 may have a single- or multi-layered structure. In addition, the first sensor electrodes 102 may be made of the same material as the second sensor electrodes 103, or be made of a material different from that of the second sensor electrodes 103. Also, the first and second sensor electrodes 102 and 103 may be plate-shaped electrodes or mesh-shaped electrodes.

The conductive material may include metals or alloys thereof. The metals may include gold (Au), silver (Ag), aluminum (Al), molybdenum (Mo), chromium (Cr), titanium (Ti), nickel (Ni), neodymium (Nd), copper (Cu), platinum (Pt), and the like.

Meanwhile, the conductive material may be a transparent conductive material. The transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, graphene, and the like.

However, the material constituting the first and second sensors 102 and 103 is not limited thereto. That is, in addition to the above-described material, any material may be used to form the first and second sensor electrodes 102 and 103 as long as it can provide conductivity.

In some exemplary embodiments, the first sensor electrodes 102 and the second sensor electrodes 103 may be provided in different layers to be spaced apart from each other. In an exemplary embodiment, at least one of an elastic layer, a piezoelectric layer, and a pressure sensitive layer may be provided between the first sensor electrodes 102 and the second sensor electrodes 103. Also, in some exemplary embodiments, a gap (e.g., an air gap) may exist between the first sensor electrodes 102 and the second sensor electrodes 103.

In some exemplary embodiments, one or more lines 104 may be connected to each of the first sensor electrodes 102 and the second sensor electrodes 103. Each line 104 may be connected to an external driving circuit through at least one pad 105. In an exemplary embodiment, the first sensor electrodes 102 and the second sensor electrodes 103 may be connected to the above-described sensor controller 80 through the lines 104 and the pads 105.

In some exemplary embodiments, a driving voltage for driving the pressure sensor 100 may be applied to at least one of the first sensor electrodes 102 and the second sensor electrodes 103, and a sensing signal corresponding to the driving voltage may be output from the other of the first sensor electrodes 102 and the second sensor electrodes 103. The presence of a touch input, a touch position of the touch input, and a pressure caused by the touch input may be detected by analyzing the sensing signal.

In an exemplary embodiment, when the pressure sensor 100 is a gap-capacitance type pressure sensor, as the capacitance between the first sensor electrodes 102 and 103 is changed in a region in which a touch input is generated and/or the periphery of the region thereof, a sensing signal input from the corresponding region may be changed. The sensor controller 80 receiving the sensing signal may detect a position at which the touch input is provided and an intensity of a pressure caused by the touch input by detecting a change in sensing signal. However, the driving method of the pressure sensor 100 according to exemplary embodiments are not limited thereto, and may be changed depending on the kind of the pressure sensor 100.

Figure 7:
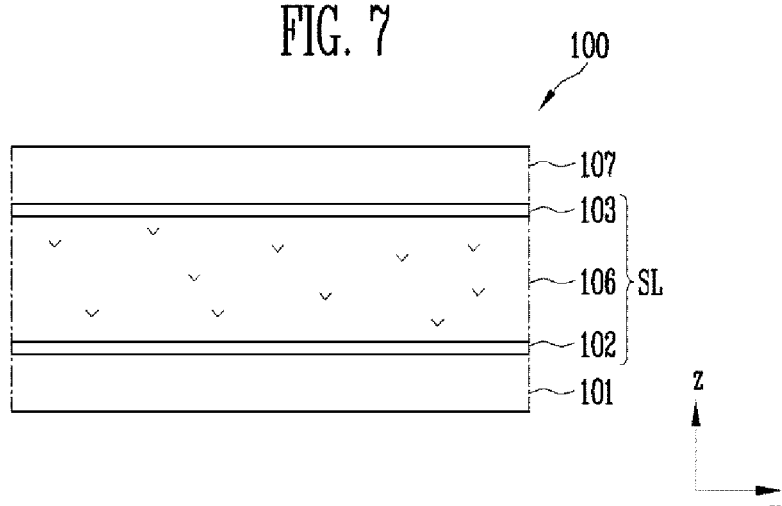
FIG. 7 illustrates an exemplary embodiment related to the pressure sensor shown in FIG. 6, for example.

FIG. 7 illustrates an exemplary embodiment related to the pressure sensor shown in FIG. 6. FIG. 7 schematically illustrates a section of a partial region (e.g., one intersection portion among the intersection portions of the first and second sensor electrodes) of the pressure sensor shown in FIG. 6. In FIG. 7, components identical to those of FIG. 6 are designated with like reference numerals, and their detailed descriptions will be omitted.

Referring to FIGS. 6 and 7, the pressure sensor 100 according to the exemplary embodiment may further include a second sensor substrate (or second substrate) 107 opposite to the first sensor substrate 101. In some exemplary embodiments, the first sensor electrodes 102 and the second sensor electrodes 103 may be respectively provided on surfaces of the first sensor substrate 101 and the second sensor substrate 107 to face each other.

In some exemplary embodiments, the second sensor substrate 107 may be made of an insulative material such as glass or resin, and have a single- or multi-layered structure. Also, the second sensor substrate 107 may be a flexible substrate or rigid substrate. In an exemplary embodiment, the second sensor substrate 107 may be made of at least one of the above-described materials mentioned as the material constituting the first display substrate 210 and/or the second display substrate 230. Also, the second sensor substrate 107 may be made of the same material as the first display substrate 210 and/or the second display substrate 230, or be made of a material different from that of the first display substrate 210 and/or the second display substrate 230. That is, in the present disclosure, the material or property of the second sensor substrate 107 is not particularly limited. In an exemplary embodiment, the second sensor substrate 107 may be configured as a substrate including at least a base substrate, or be configured as an insulating layer including one or more layers, which is formed on the first sensor substrate 101 and a sensor layer SL.

Also, the pressure sensor 100 according to the exemplary embodiment may further include an elastic layer 106 provided between the first sensor electrodes 102 and the second sensor electrodes 103. The elastic layer 106 along with the first and second sensor electrodes 102 and 103 may constitute the sensor layer SL.

Specifically, the first and second sensor electrodes 102 and 103 are spaced apart from each other with the elastic layer 106 interposed therebetween, and a capacitance may be formed between the first and second sensor electrodes 102 and 103 overlapping with each other (i.e., an intersection portion between the first and second sensor electrodes 102 and 103). The capacitance between the first and second sensor electrodes 102 and 103 may be changed depending on the distance at which the first and second sensor electrodes 102 and 103 are spaced apart from each other.

For example, when a touch input is provided on the pressure sensor 100, the distance between at least a pair of first and second sensor electrodes 102 and 103 disposed at a point at which the touch input is provided or disposed around the point may be changed. Accordingly, the capacitance between the first and second sensor electrode 102 and 103 can be changed. Thus, when a touch input is provided in the touch region TA, a position at which the touch input is provided and a pressure caused by the touch input can be detected by detecting a change in capacitance between the first and second sensor electrode 102 and 103.

Meanwhile, in FIG. 7, it is illustrated that the gap-capacitance type pressure sensor is used as the pressure sensor 100 according to the exemplary embodiment, but the kind of the pressure sensor 100 according to exemplary embodiments are not particularly limited. Also, in FIG. 7, a case where the first sensor electrode 102 is located on the bottom of the second sensor electrode 103 is illustrated as an example, but this may be changed. For example, in another exemplary embodiment, the first sensor electrode 102 may be located on the top of the second sensor electrode 103. Here, the top and the bottom may be defined based on, for example, a z direction.

The elastic layer 106 may be located between the first sensor electrodes 102 and the second sensor electrodes 103. For example, one surface of the elastic layer 106 may be in contact with the first sensor electrodes 102, and the other surface of the elastic layer 106 may be in contact with the second sensor electrodes 103. In some exemplary embodiments, the elastic layer 106 may be entirely located on the touch region TA or be located at each of the intersection portions of the first sensor electrodes 102 and the second sensor electrodes 103.

The elastic layer 106 may reduce external impact. In this exemplary embodiment, the elastic layer 106 may have elasticity. For example, the elastic layer 106 is deformed by a pressure from the outside, and may have elasticity that enables the elastic layer 106 to return to the original state when the pressure from the outside is eliminated. In addition, the elastic layer 106 may have an insulating property so as to prevent an electrical short circuit between the first sensor electrodes 102 and the second sensor electrodes 103.

In some exemplary embodiments, the elastic layer 106 may be provided as a porous polymer to have elasticity. For example, the elastic layer 106 may be provided in the form of a foaming body such as sponge.

In an exemplary embodiment, the elastic layer 106 may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene), polyurethanes, polychloroprene, polyethylene, silicon, and the like, and combinations thereof. However, the material constituting the elastic layer 106 is not limited thereto. In addition, another material having elasticity may be used as the material constituting the elastic layer 106.

Figure 8A:
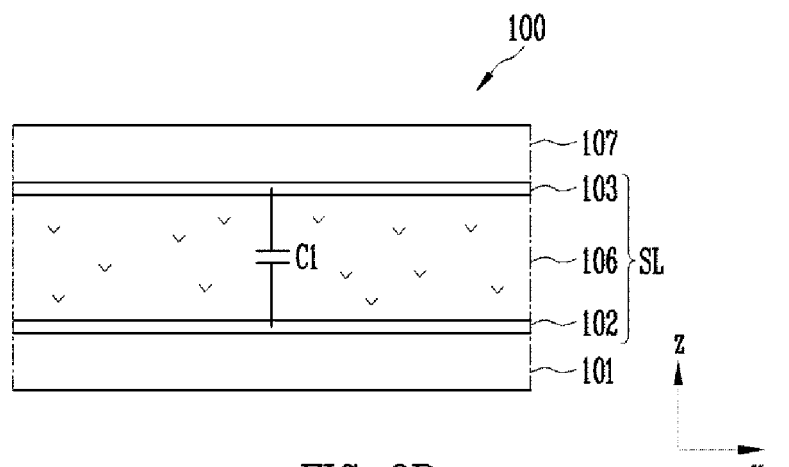
FIGS. 8A and 8B illustrate an operation of the pressure sensor shown in FIG. 7.
Figure 8B:
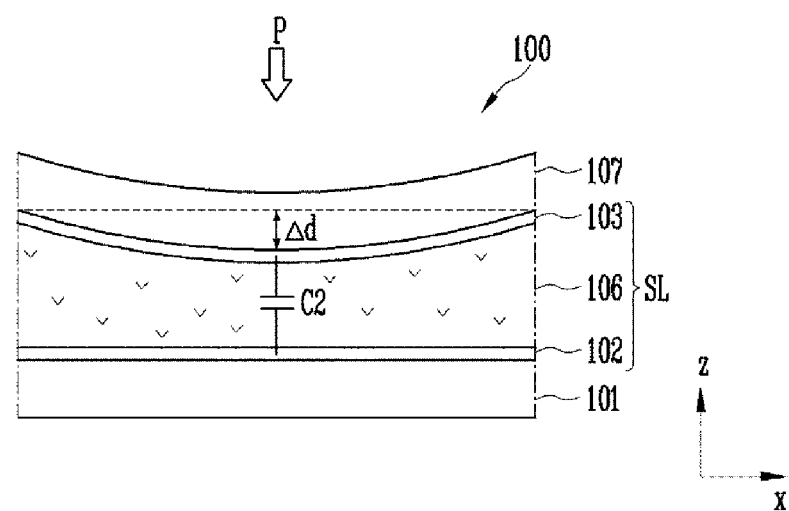

FIGS. 8A and 8B illustrate an operation of the pressure sensor shown in FIG. 7. Specifically, FIG. 8A illustrates a state in which any pressure is not applied to the pressure sensor 100, and FIG. 8B illustrates a state in which a pressure is applied to the pressure sensor 100.

Referring to FIG. 8A, when any pressure is not applied to the pressure sensor 100, a first capacitance C1 may be formed between the first sensor electrode 102 and the second sensor electrode 103.

Referring to FIG. 8B, when a pressure P is applied to the pressure sensor 100 as a touch, etc. of a user is provided, the pressure sensor 100 may be deformed along the direction in which the pressure P is applied. For example, a displacement may be generated in the pressure sensor 100 in at least the z direction (e.g., a thickness direction of the pressure sensor 100). Accordingly, the distance between the first sensor electrode 102 and the second sensor electrode 103 is changed at a position at which the pressure P is applied or the periphery thereof. Therefore, the capacitance between the first sensor electrode 102 and the second sensor electrode 103 may be changed.

For example, if the distance between the first sensor electrode 102 and the second sensor electrode 103 is changed by d due to the pressure P, the first capacitance C1 may be changed to a second capacitance C2. As the external pressure P increases, d increases, and accordingly, the capacitance between the first sensor electrode 102 and the second sensor electrode 103 may increase.

Therefore, an intensity of the pressure P may be detected by detecting a change in capacitance generated in the pressure sensor. In addition, d that is a degree to which the pressure sensor 100 is deformed (hereinafter, referred to as a displacement of the pressure sensor 100) may be calculated using the change in capacitance.

The pressure P applied to the pressure sensor 100 may be frequently generated due to a touch of a user, but exemplary embodiments are not limited thereto. That is, the pressure P may be applied to the pressure sensor 100 due to various factors.

Figure 9:
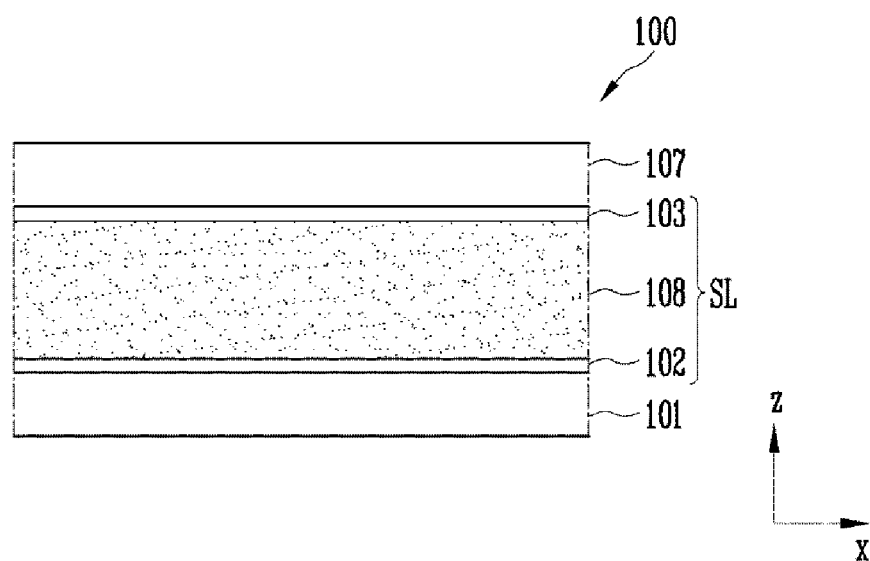
FIG. 9 illustrates another exemplary embodiment related to the pressure sensor shown in FIG. 6, for example.

FIG. 9 illustrates another exemplary embodiment related to the pressure sensor shown in FIG. 6. In FIG. 9, components identical to those of the above-described embodiment are designated by like reference numerals, and their detailed descriptions will be omitted.

Referring to FIG. 9, the pressure sensor 100 according to the exemplary embodiment may include first and second sensor electrodes 102 and 103 respectively provided on surfaces of the first sensor substrate 101 and the second sensor substrate 107, and a piezoelectric layer 108 provided between the first and second sensor electrodes 102 and 103. The piezoelectric layer 108 along the first and second sensor electrodes 102 and 103 may constitute a sensor layer SL.

In some exemplary embodiments, one surface of the piezoelectric layer 108 may be in contact with the first sensor electrodes 102, and the other surface of the piezoelectric layer 108 may be in contact with the second sensor electrodes 103. In some exemplary embodiments, the piezoelectric layer 108 may be entirely located on the touch region TA or be located at each of the intersection portions of the first sensor electrodes 102 and the second sensor electrodes 103.

The piezoelectric layer 108 may include a piezoelectric material that exhibits a piezoelectric effect according to a pressure applied from the outside. Examples of the piezoelectric material may be lead zirconate titanate (PZT), polyvinylidene fluoride (PVDF), barium titanate ($BaTiO_3$), polytrifluoroethylene (PTrFE), and the like. Also, the piezoelectric material may be a piezoelectric semiconductor material such as poly crystal, PMN-PT single crystal, zinc oxide (ZnO), or molybdenum disulphide ($MoS_2$). However, the material constituting the piezoelectric layer 108 is not limited thereto, and the piezoelectric layer 108 may be made of another piezoelectric material in addition to the above-described material.

When a touch input is provided to the pressure sensor 100, a piezoelectric effect occurs as the property of the piezoelectric layer 108 is changed. Thus, a point at which the property of the piezoelectric layer 108 is changed and a change in property are detected by analyzing a sensing signal output from the first sensor electrodes 102 and/or the second sensor electrodes 103, so that it is possible to detect a position at which the touch input is provided and a pressure caused by the touch input.

Figure 10:
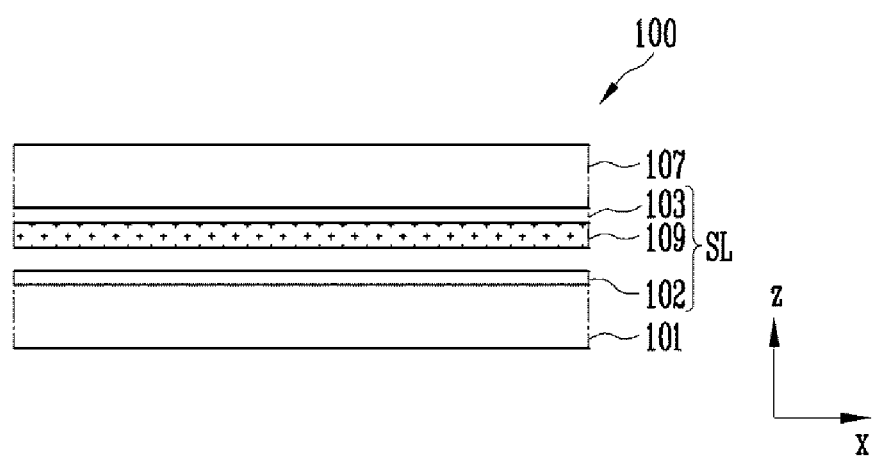
FIG. 10 illustrates still another exemplary embodiment related to the pressure sensor shown in FIG. 6, for example.

FIG. 10 illustrates still another exemplary embodiment related to the pressure sensor shown in FIG. 6. In FIG. 10, components identical to those of the above-described exemplary embodiments are designated with like reference numerals, and their detailed descriptions will be omitted.

Referring to FIG. 10, the pressure sensor 100 according to the exemplary embodiment may include first and second sensor electrodes 102 and 103 respectively provided on surfaces of the first sensor substrate 101 and the second sensor substrate 107, and a pressure sensitive layer (or force sensitive layer) 109 provided between the first and second sensor electrodes 102 and 103. The pressure sensitive layer 109 along with the first and second sensor electrodes 102 and 103 may constitute a sensor layer SL.

In some exemplary embodiments, the pressure sensitive layer 109 may be provided on one surface of the first sensor electrodes 102 and/or the second sensor electrodes 103. In an exemplary embodiment, the pressure sensitive layer 109 may be provided on one surface of the second sensor electrodes 103 facing the first sensor electrodes 102 to be spaced apart from the first sensor electrodes 102. In this case, a spacer (not shown), may be provided between the first and second sensor substrates 101 and 107. In some exemplary embodiments, the pressure sensitive layer 109 may be entirely located on the touch region TA or be located at each of the intersection portions of the first sensor electrodes 102 and the second sensor electrodes 103. Also, the pressure sensitive layer 109 may have a single- or multi-layered structure.

The pressure sensitive layer 109 may include materials called as pressure sensitive materials or pressure sensitive resistors of which electrical characteristics are changed depending on a pressure applied from the outside. Examples of the pressure sensitive materials may be nano particles, graphene, quantum tunneling composites (QTC), and the like, but exemplary embodiments are not limited thereto. The nano particles may be provided in the form of a nano tube, a nano column, a nano rod, a nano pore, a nano wire, etc. Also, in some exemplary embodiments, the nano particles may be provided in a form in which they are distributed in polymer.

The nano particles may include particles of carbon, graphite, a metalloid, a metal, a conductive oxide of the metalloid or the metal, and a conductive nitride of the metalloid or the metal, or include particles in a core shell structure, in which the particles are coated on an insulating bead, or a combination thereof. The metalloid may include any one of antimony (Sb), germanium (Ge), and arsenic (As), or an alloy thereof. The metal may include a zinc (Zn), aluminum (Al), scandium (Sc), chrome (Cr), manganese (Mn), iron (Fe), cobalt (Co), nickel (Ni), copper (Cu), indium (In), tin (Sn), yttrium (Y), zirconium (Zr), niobium (Nb), molybdenum (Mo), ruthenium (Ru), rhodium (Rh), palladium (Pd), gold (Au), silver (Ag), platinum (Pt), strontium (Sr), tungsten (W), cadmium (Cd), tantalum (Ta), titanium (Ti), or an alloy thereof. The conductive oxide may include an indium tin oxide (ITO), an indium zinc oxide (IZO), an aluminum doped zinc oxide (AZO), a gallium indium zinc oxide (GIZO), a zinc oxide (ZnO), and a mixture thereof.

If a pressure (e.g., a pressure caused by a touch input) is applied to the pressure sensor 100, the electron transfer probability is changed as the tunnel effect between nano particles provided in, for example, the pressure sensitive layer 109. Accordingly, the resistance of the pressure sensitive layer 109 is changed. Thus, an intensity of the pressure, etc. can be detected by detecting a change in resistance. The pressure sensor 100 having the pressure sensitive layer 109 applied thereto can easily detect a pressure caused by a touch input even when no deformation caused by the touch input occurs or when a degree of deformation, i.e., a displacement is small.

Meanwhile, the pressure sensor 100 according to the present disclosure may be a pressure sensor of another type except the pressure sensor of the type described in the exemplary embodiments of FIGS. 5 to 10. Also, in the above-described exemplary embodiments, it is illustrated that the first sensor electrodes 102 and the second sensor electrodes 103 extend in a bar shape along any one direction, but the electrode structure applicable to the pressure sensor 100 is not limited thereto. In an exemplary embodiment, the pressure sensor 100 may include island-shaped or dot-shaped sensor electrodes that are distributed in the touch region TA. Also, in some exemplary embodiments, each of the sensor electrodes may be configured as a deformation sensitive device capable of detecting a small displacement.

Figure 11:
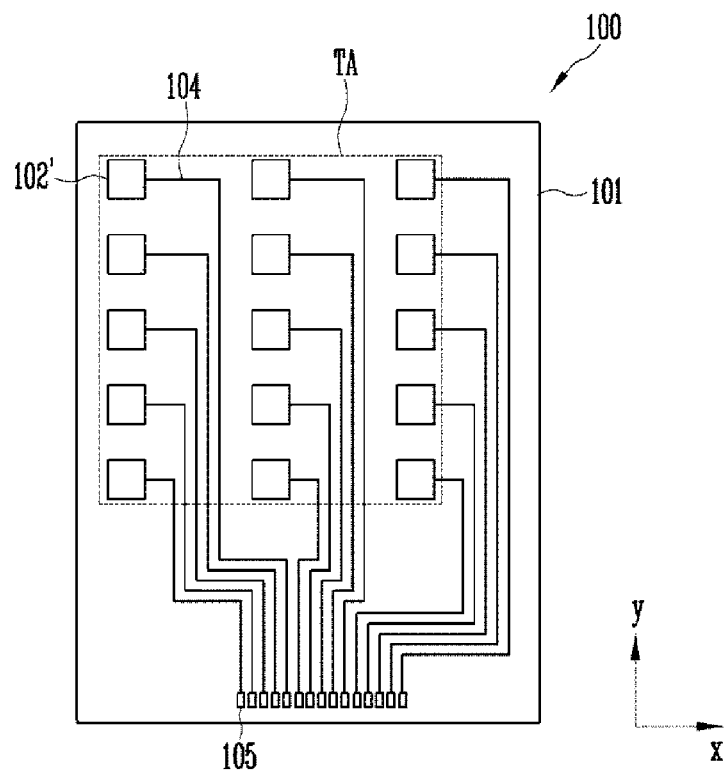
FIG. 11 illustrates a pressure sensor according to an exemplary embodiment.

FIG. 11 illustrates a pressure sensor according to an exemplary embodiment.

Referring to FIG. 11, the pressure sensor 100 according to the present disclosure may include a plurality of island-shaped sensor electrodes 102' distributed in a touch region TA on a first sensor substrate 101. The "island-shaped" may be broadly representative of individual shapes of individual patterns separated from each other, and each individual pattern may have various shapes, such as a square or circular shape. For convenience, a case where the sensor electrodes 102' have a quadrangular shape is illustrated in FIG. 11, but the shape of the sensor electrodes 102' may be variously changed. Also, in some exemplary embodiments, the size, number, density, and/or distribution of the sensor electrodes 102' may be variously changed.

In some exemplary embodiments, the sensor electrodes 102' may be provided in an island shape (e.g., a square island shape) at positions corresponding to respective coordinate points defined on the touch region to be separated from one another. In an exemplary embodiment, the sensor electrodes 102' may be distributed in a matrix form on the touch region TA. For example, the sensor electrodes 102' may be arranged along the first and second directions (e.g., the x-axis and y-axis directions) and spaced apart from each other. At least one line 104 may be connected to each of the sensor electrodes 102', and the sensor electrode 102' may be connected to at least one pad 105 through the line 104.

In some exemplary embodiments, the sensor electrodes 102' may include a conductive material. In an exemplary embodiment, the sensor electrodes 102' may include at least one of the conductive materials mentioned as examples of the material constituting the above-described first and second sensor electrodes 102 and 103. In addition, the sensor electrodes 102' may be made of another conductive material. The sensor electrodes 102' may have a single- or multi-layered structure.

Also, the sensor electrodes 102' may have various structures. In an exemplary embodiment, each of the sensor electrodes 102' may have a strain gauge structure or include a pressure sensitive material. In some exemplary embodiments, a protective layer (not shown), an upper substrate (not shown), or the like may be further provided on the top of the sensor electrodes 102'. In an exemplary embodiment, the second sensor substrate 107 or the like, which is described in the above-described exemplary embodiments, may be provided on the top of the sensor electrodes 102'.

When a pressure caused by a touch input is applied to the pressure sensor 100, electrical characteristics of one or more sensor electrodes 102' located in a region in which the pressure is applied or the periphery thereof are changed. Thus, a position of the touch input, an intensity of the pressure, and the like can be detected by analyzing a sensing signal output from the sensor electrodes 102'.

Figure 12:
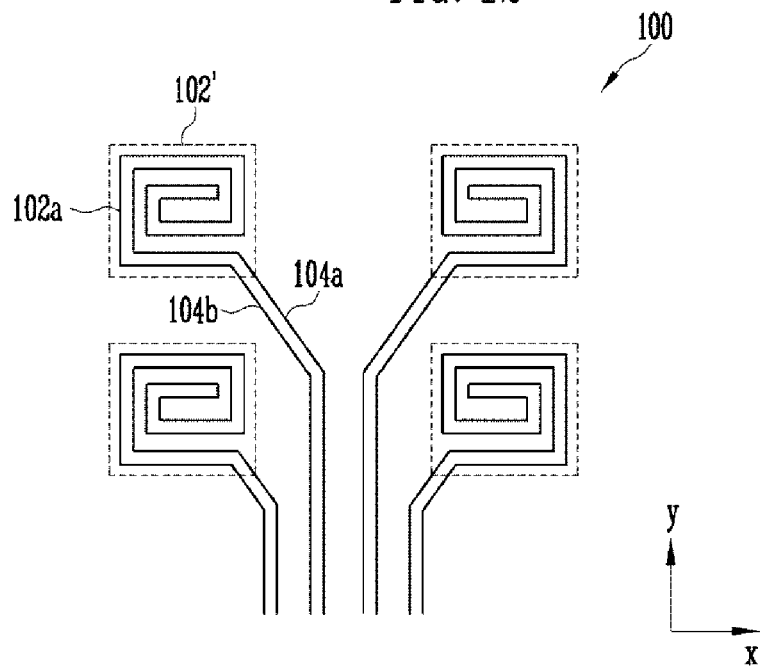
FIG. 12 illustrates an example of a sensor electrode shown in FIG. 11.

FIG. 12 illustrates an example of the sensor electrode shown in FIG. 11. FIG. 12 illustrates a partial region of the pressure sensor shown in FIG. 11, particularly, a portion of the touch region, which illustrates an exemplary structure of the sensor electrode.

Referring to FIGS. 11 and 12, each of the sensor electrodes 102' may be configured as a deformation sensitive device having a strain gauge structure to detect a small displacement. In an exemplary embodiment, each of the sensor electrodes 102' may be configured as a bent resistive element 102a.

A first line 104a and a second line 104b may be connected to the resistive element 102a. That is, in some exemplary embodiments, each of the sensor electrodes 102' may be connected to a plurality of lines 104a and 104b.

When a pressure is applied in the touch region TA, the resistance value of a corresponding sensor electrode 102' is changed as the length or sectional area of a resistive element 102a located at a point at which the pressure is applied or the periphery of the point thereof is changed. Thus, a position of a touch input, an intensity of the pressure, and the like can be detected by detecting a position at which the resistance value of the sensor electrode 102' is changed, a variation in resistance, and the like, using a sensing signal output from the sensor electrode 102'.

Figure 13:
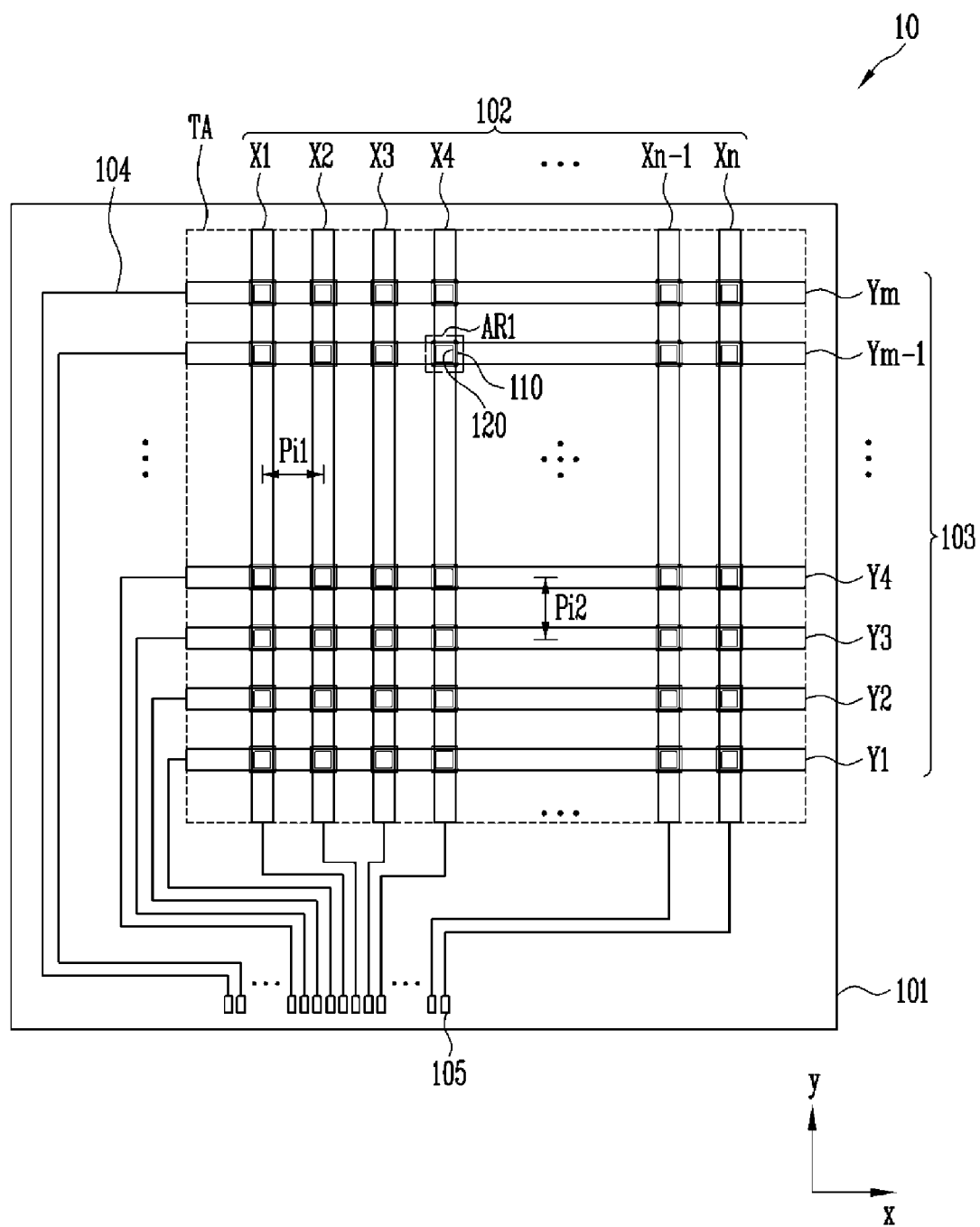
FIG. 13 illustrates a touch sensor according to an exemplary embodiment.
Figure 14A:
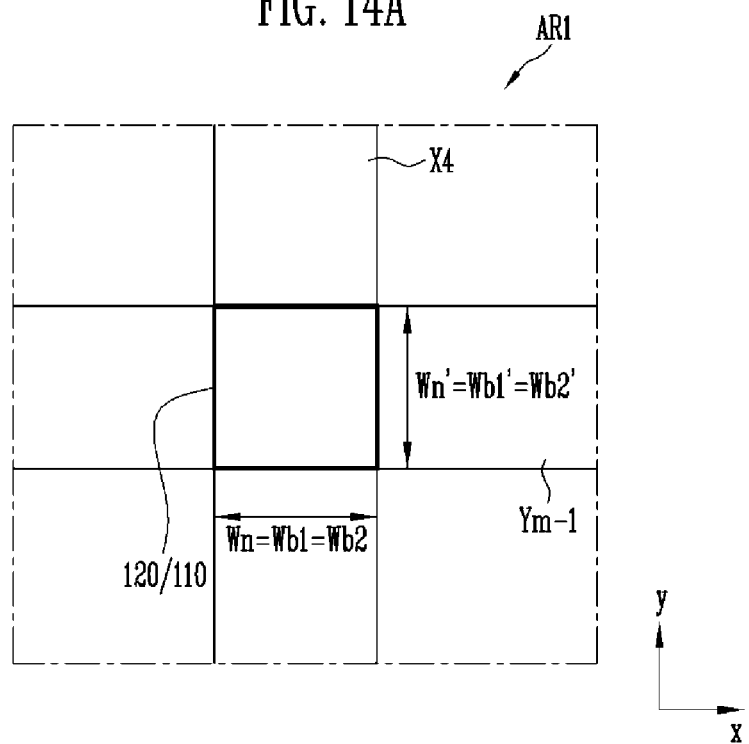
FIGS. 14A and 14B illustrate one region of the touch sensor shown in FIG. 13.
Figure 14B:
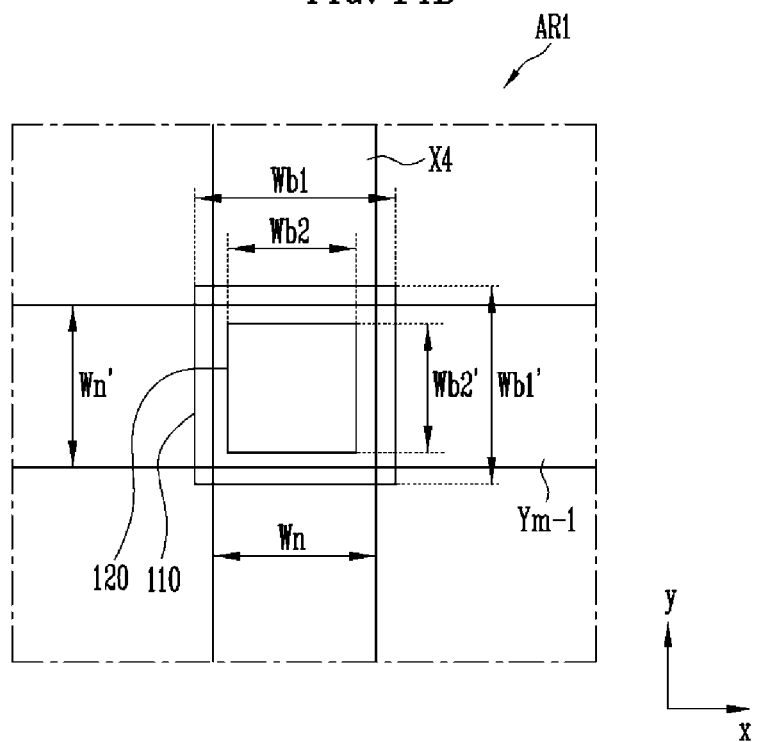
Figure 15:
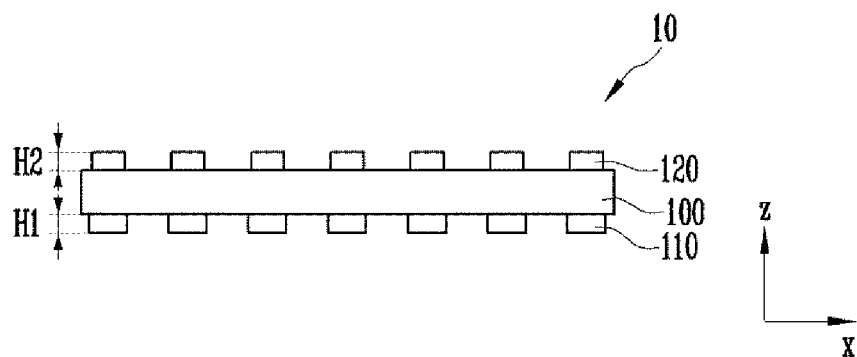
FIG. 15 schematically illustrates a section of the touch sensor shown in FIG. 13.

FIG. 13 illustrates a touch sensor according to an exemplary embodiment. FIGS. 14A and 14B illustrate one region of the touch sensor shown in FIG. 13. Specifically, FIGS. 14A and 14B schematically illustrate a plane of a region AR1 which is one intersection portion among intersection portions of the first and second sensor electrodes shown in FIG. 13 so as to illustrate an exemplary embodiment related to the intersection portions. FIG. 15 schematically illustrates a section of the touch sensor shown in FIG. 13. In FIGS. 13 to 15, components similar or identical to those of the above-described exemplary embodiments are designated by like reference numerals, and their detailed descriptions will be omitted.

Referring to FIGS. 13 to 15, the touch sensor 10 according to the exemplary embodiment includes a pressure sensor 100 and a plurality of bumps 110 and 120 distributed on a touch region TA of the pressure sensor 100. In some exemplary embodiments, the pressure sensor 100 may include the first and second sensor electrodes 102 and 103 described in FIG. 6. Also, in some exemplary embodiments, the bumps 110 and 120 may include the first and second bumps 110 and 120 described in FIGS. 2 and 3.

In some exemplary embodiments, the first and second bumps 110 and 120 may be provided on outer surfaces of the pressure sensor 100 to be separated from the first and second sensor electrodes 102 and 103. Also, the bumps 110 and 120 may be distributed in island shapes separated from each other in the touch region TA. However, exemplary embodiments are not limited thereto. For example, in another exemplary embodiment, at least some of the bumps 110 and 120 may be integrally connected to each other.

In some exemplary embodiments, the first and second bumps 110 and 120 may be distributed at respective coordinate points defined on the touch region TA of the pressure sensor 100, e.g., on respective intersection portions at which the first sensor electrodes 102 and the second sensor electrodes 103 intersect each other. For example, the first bumps 110 are provided on a lower surface (or a rear or bottom surface) of the pressure sensor 100, and may be distributed at positions corresponding to (e.g., overlapping with) the intersection portions of the first and second sensor electrodes 102 and 103. In addition, the second bumps 120 are provided on an upper surface (or a front or top surface) of the pressure sensor 100, and may be distributed at positions corresponding to the intersection portions of the first and second sensor electrodes 102 and 103.

The lower and upper surfaces of the pressure sensor 100 may mean the outer surfaces of the pressure sensor 100, respectively. For example, the lower surface of the pressure sensor 100 may be the lower surface (or a rear or bottom surface) of the first sensor substrate 101 shown in FIGS. 6 to 10, and the upper surface of the pressure sensor 100 may be the upper surface (or a front or top surface) of the second sensor substrate 107 shown in FIGS. 6 to 10. That is, the first and second bumps 110 and 120 may be provided on the other surfaces (outer surfaces) opposite to one surfaces (inner surfaces) on which the first and second sensor electrodes 102 and 103 are disposed among both surfaces of the first and second sensor substrate 101 and 107. Alternatively, when assuming that a protective layer (not shown) is provided on the top and/or bottom of the pressure sensor 100, the first and second bumps 110 and 120 may be provided on an outer surface of the protective layer.

A pair of first and second bumps 110 and 120 overlapping with each other may be located on each intersection portion (i.e., each coordinate point of the touch region TA). In some exemplary embodiments, the first and second bumps 110 and 120 may be provided on different surfaces of the pressure sensor 100 to overlap with each other in the thickness direction of the pressure sensor 100. That is, the first and second bumps 110 and 120 may overlap with each other at each coordinate point of the touch region TA with the pressure sensor 100 interposed therebetween.

In some exemplary embodiments, the pair of first and second bumps 110 and 120 may be located on each intersection portion of the first and second sensor electrodes 102 and 103 to completely overlap with each other while having the substantially same size and shape as shown in FIG. 14A. In an exemplary embodiment, the first and second bumps 110 and 120 may be respectively provided at upper (e.g., top or front) and lower (e.g., bottom or rear) portions of a corresponding intersection portion to overlap with each other while having widths Wb1, Wb1', Wb2, and Wb2' equal to widths Wn and Wn' of the intersection portion in first and second directions (e.g., x and y directions).

Alternatively, in some exemplary embodiments, the first and second bumps 110 and 120 may be located on each intersection portion of the first and second sensor electrodes 102 and 103 to overlap with each other while having different size and/or different shapes as shown in FIG. 14B. In an exemplary embodiment, each of the first bump 110 may have widths Wb1 and Wb1' equal to or larger than those Wn and Wn' of a corresponding intersection portion in the first and second directions (e.g., x and y directions). That is, each of the first bumps 110 may be provided on the bottom of the intersection portion while having an area equal to or larger than that of the intersection portion on which the first bump 110 is located. In this case, each of the first bumps 110 can stably support the region in which the intersection portion is located. In addition, when a pressure caused by a touch input is applied, each of the bumps 110 can concentrate the pressure on the intersection portion that is an effective point. Accordingly, the mechanical stability of the touch sensor 10 can be ensured, and the sensitivity of the pressure sensor 100 can be improved.

In addition, each of the second bumps 120 may have widths Wb2 and Wb2' smaller than those Wn and Wn' of a corresponding intersection portion in the first and second directions. That is, each of the second bumps 120 may be located in the region in which the intersection portion is located while having an area smaller than that of the corresponding intersection portion. In this case, when a pressure caused by a touch input is applied, the pressure can be effectively concentrated on the intersection portion that is an effective point even when a propagation phenomenon occurs. Accordingly, the sensitivity of the pressure sensor 100 can be improved.

In some exemplary embodiments, the bumps 110 and 120 may be disposed on every intersection portion of the touch region TA. Therefore, pitches between adjacent bumps 110 and 120 in the first and second directions may be substantially equal to those (i.e., a pitch Pi1 between adjacent first sensor electrodes 102 and a pitch Pi2 between adjacent second sensor electrodes 103) between adjacent intersection portions in the first and second directions.

In the touch sensor 10 having the bumps 110 and 120, the first and second electrodes 102 and 103 may be disposed with a large pitch, as compared with a touch sensor of a comparative example, which does not have the bumps 110 and 120. As the pitch between the bumps 110 and 120 increases, the pressure concentration effect can be improved. That is, as the pitch between the bumps 110 and 120 is widened, the sensitivity of the pressure sensor 100 can be further improved.

Meanwhile, when the pitch between the bumps 110 and 120 is set, a factor such as a resolution of the pressure sensor 100 or propagation (e.g., substrate propagation, etc.) may be considered in addition to the above-described pressure concentration effect. For example, the pitch between bumps may be set based on an experimental result obtained by considering the pressure concentration effect and the propagation, within a range that satisfies a predetermined resolution.

In an exemplary embodiment, in the touch sensor of the comparative example, which includes the first and second sensor electrodes 102 and 103 each having a width of about 2 mm and is configured with only the pressure sensor 100 without any bump structure, the pitch between the first and second sensor electrodes 102 and 103 may be set to about 2 mm to 3 mm so as to provide a predetermined resolution and a predetermined sensitivity. On the other hand, in the touch sensor 10 of the present exemplary embodiment, which includes the first bumps 110 and/or the second bumps 120, the pitch between the bumps (or the pitch between the sensor electrodes) may be set to 4 mm to 6 mm, which is wider than that in the touch sensor of the comparative example. Accordingly, the pressure concentration effect can be provided within a range that satisfies a predetermined resolution, thereby maximizing the sensitivity of the pressure sensor 100.

In some exemplary embodiments, heights H1 and H2 of the bumps 110 and 120 may be set equal to or higher than a height at which the pressure concentration effect can be expected. For example, the heights H1 and H2 of the bumps 110 and 120 may be set to about 100 µm or more.

FIGS. 16 to 20 each schematically illustrates a section of a touch sensor according to an exemplary embodiment, which illustrate different modifications of the exemplary embodiment shown in FIGS. 13 to 15. In FIGS. 16 to 20, components identical to those of the above-described exemplary embodiments are designated with like reference numerals, and their detailed descriptions will be omitted.

Figure 16:
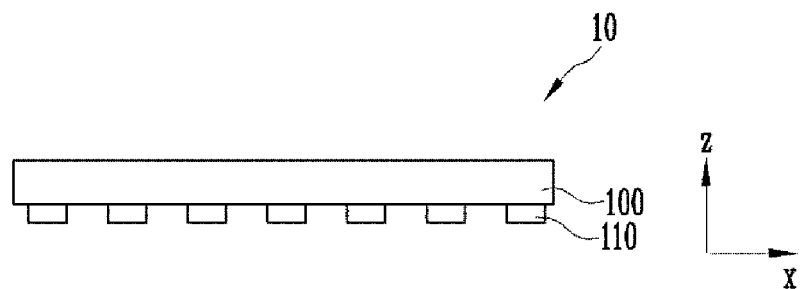
FIGS. 16, 17, 18, 19 and 20 each schematically illustrates a section of a touch sensor according to an exemplary embodiment.

Referring to FIG. 16, the touch sensor 10 according to the exemplary embodiment may include the pressure sensor 100 and the first bumps 110 provided on the lower surface of the pressure sensor 100. That is, in some exemplary embodiments, the bump structure is provided on only the lower surface of the pressure sensor 100, and may not be provided on the upper surface of the pressure sensor 100.

Figure 17:
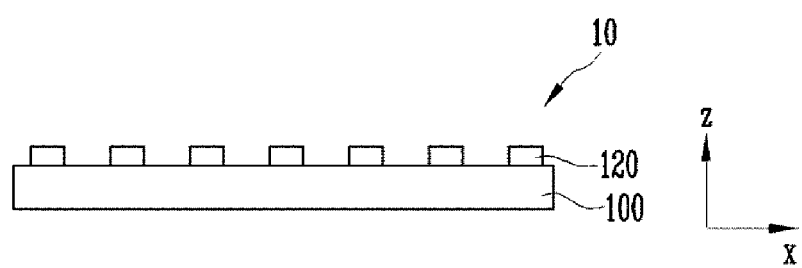

Referring to FIG. 17, the touch sensor 10 according to the exemplary embodiment may include the pressure sensor 100 and the second bumps 120 provided on the upper surface of the pressure sensor 100. That is, in some exemplary embodiments, the bump structure is provided on only the upper surface of the pressure sensor 100, and may not be provided on the lower surface of the pressure sensor 100.

Figure 18:
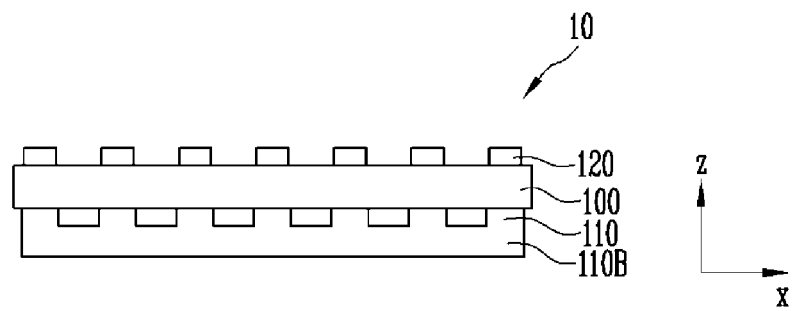

Referring to FIG. 18, in some exemplary embodiments, at least some of the bumps 110 and 120 may be connected to each other. For example, the touch sensor 10 according to the exemplary embodiment may further include a bump body 110B which is disposed on bottom surfaces (e.g., lower or rear surfaces) of the first bumps 110 and integrally connects the first bumps 110 to each other. The first bumps 110 and the bump body 110B may constitute a bump bracket (or a bump housing), and the second bumps 120 may be distributed to be separated from each other.

Figure 19:
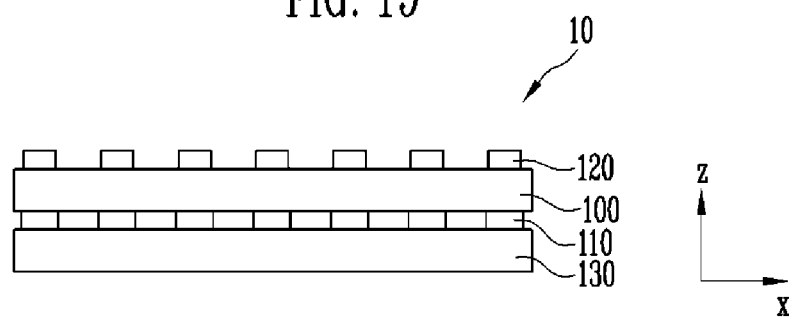

Referring to FIG. 19, the touch sensor 10 according to the exemplary embodiment may further include a supporting layer 130 provided on one surface of the bump structure. In an exemplary embodiment, the touch sensor 10 may include the supporting layer 130 provided on lower surfaces (e.g., rear or bottom surfaces) of the first bumps 110. In some exemplary embodiments, the supporting layer 130 has a substantially flat surface, and may be configured as a high modulus substrate or the like, which has a modulus of 2 GPa or more.

As described in the exemplary embodiments shown in FIGS. 18 and 19, if the bump bracket or the supporting layer 130 is provided at a lower portion (e.g., a rear or bottom portion) of the pressure sensor 100, the touch sensor 10 can be more stably disposed at the inside of the above-described housing 70. In an exemplary embodiment, in the display device 1 shown in FIGS. 2A to 3, as a battery, a circuit board, or the like is mounted on the bottom surface of the housing 70, the touch sensor 10 can be stably disposed at the inside of the housing 70 even when the top of the bottom surface of the housing 70 is not flat.

Figure 20:
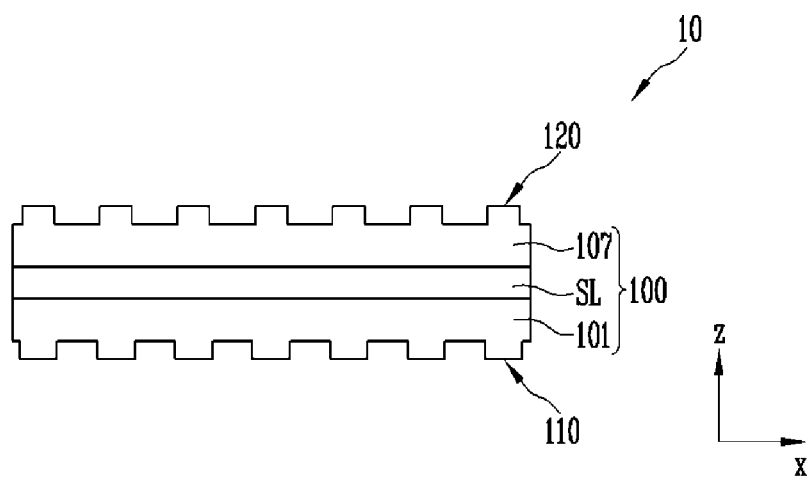

Referring to FIG. 20, in some exemplary embodiments, at least some of the bumps 110 and 120 may be integrally formed with the pressure sensor 100. For example, the first bumps 110 may be integrally connected to the first sensor substrate 101, and the second bumps 120 may be integrally connected to the second sensor substrate 107. In an exemplary embodiment, the first bumps 110 may be configured to protrude in the thickness direction of the first sensor substrate 101 from a lower surface (or a rear or bottom surface) of the first sensor substrate 101, and the second bumps 120 may be configured to protrude in the thickness direction of the second sensor substrate 107 from an upper surface (or a front or top surface) of the second sensor substrate 107. Here, the thickness direction may be, for example, a z direction. That is, in some exemplary embodiments, protrusion parts are formed on an outer surface of at least one of the first sensor substrate 101 and the second sensor substrate 107, so that the first bumps 110 and/or the second bumps 120 can be integrally formed with the pressure sensor 100.

Figure 21A:
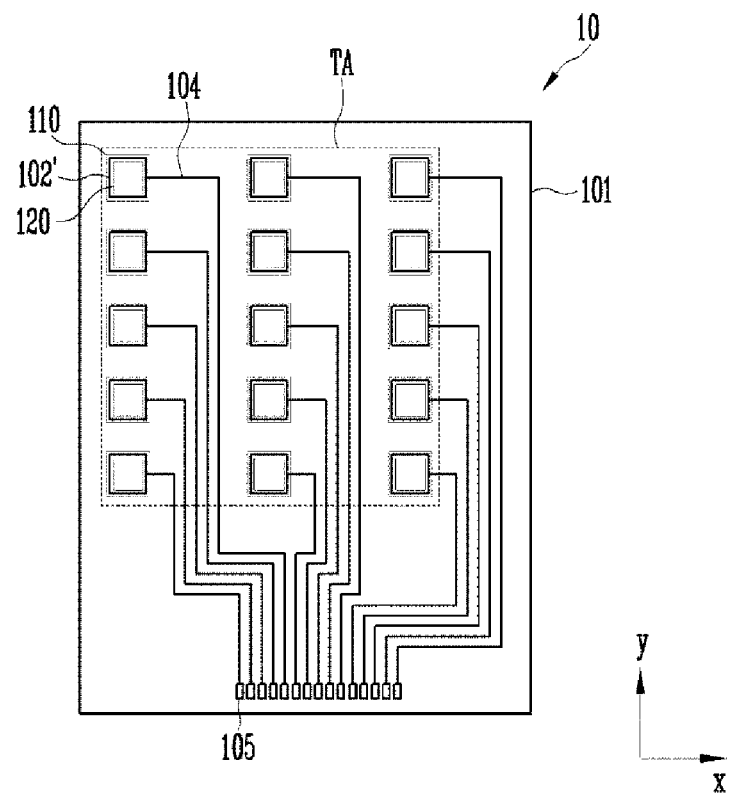
FIGS. 21A, 21B, and 21C illustrate a touch sensor according to an exemplary embodiment.
Figure 21B:
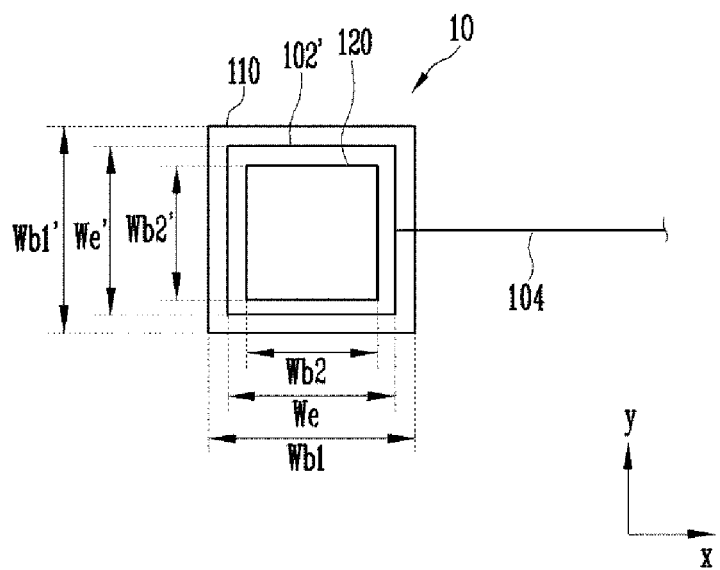
Figure 21C:
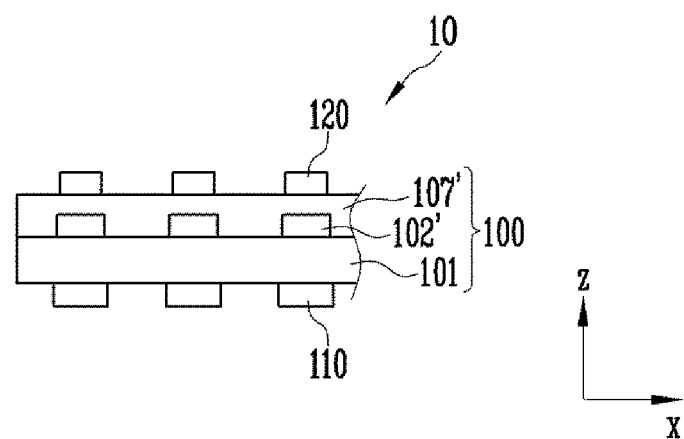

FIGS. 21A to 21C illustrate a touch sensor according to an exemplary embodiment. Specifically, FIG. 21a schematically illustrates the entire planar structure of a touch sensor according to an exemplary embodiment. FIG. 21B illustrates one region of the touch sensor shown in FIG. 21A. In particular, FIG. 21B is an enlarged view illustrating a region in one of sensor electrodes shown in FIG. 21A is provided. FIG. 21C schematically illustrates a section of the touch sensor shown in FIGS. 21A and 21B. In FIGS. 21A to 21C, components identical to those of the above-described embodiment are designated with like reference numerals, and their detailed descriptions will be omitted.

Referring to FIGS. 21A to 21C, the touch sensor 10 according to the exemplary embodiment may include a pressure sensor 100 including sensor electrodes 102' distributed in a touch region TA as described in FIGS. 11 and 12, and a bump structure including a plurality of bumps 110 and 120 distributed on the touch region TA. In some exemplary embodiments, the bumps 110 and 120 may include at least one of the first bumps 110 and the second bumps 120, which are described in FIGS. 2A to 3 and 13 to 20. That is, the bump structure may include at least one of a plurality of first bumps 110 provided on a lower surface (or a rear or bottom surface) of the pressure sensor 100 (e.g., a lower surface of a first sensor substrate 101) and a plurality of second bumps 120 provided on an upper surface (or a front or top surface) of the pressure sensor 100 (e.g., an upper surface of a protective layer (or second sensor substrate) 107' provided on the sensor electrodes 102').

In some exemplary embodiments, the sensor electrodes 102' may be island-shaped electrodes provided at positions corresponding to respective coordinates on the touch region TA to be separated from each other. For example, the sensor electrodes 102' may be arranged along the first direction (e.g., the x-axis direction) and the second direction (e.g., the y-axis direction) so as to be separated from each other, and each sensor electrode 102' may have an island shape. In some exemplary embodiments, the protective layer 107' including an insulating layer having at least one layer may be provided over the sensor electrodes 102'. In some exemplary embodiments, the protective layer 107' is entirely provided on one surface of the touch sensor 10 including the touch region TA, and may be opened in a region in which pads 105 are provided.

In some exemplary embodiments, the bumps 110 and 120 may be provided to overlap with the respective sensor electrodes 102'. In an exemplary embodiment, a pair of first and second bumps 110 and 120 may be respectively provided on the bottom and top of each of the sensor electrodes 102' to overlap with each other.

In some exemplary embodiments, each of the first bumps 110 may have widths Wb1 and Wb1' equal to or larger than those We and We' of a corresponding sensor electrode 102' in first and second directions (e.g., x and y directions). That is, each of the first bumps 110 may have an area equal to or larger than that of the sensor electrode 102' provided in the region in which the first bump 110 is located. The first bump 110 can stably support the region in which the sensor electrode 102' is provided. In addition, when a pressure caused by a touch input is applied, the first bump 110 can concentrate the pressure on the sensor electrode 102'. Accordingly, the mechanical stability of the touch sensor 10 can be ensured, and the sensitivity of the pressure sensor 100 can be improved.

In addition, each of the second bump 120 may have widths Wb2 and Wb2' smaller than those We and We' of a corresponding sensor electrode 102' in the first and second directions. That is, each of the second bumps 120 may have an area smaller than that of a sensor electrode 102' provided in a region in which the second bump 120 is located, and be located in a region in which the sensor electrode 102' is located. Accordingly, when a pressure caused by a touch input is applied, the pressure can be effectively concentrated on the sensor electrode 102' that is an effective point even when a propagation phenomenon occurs. Accordingly, the sensitivity of the touch sensor 10 can be improved.

However, exemplary embodiments are not limited thereto. For example, the first and second bumps 110 and 120 may completely overlap with each other while having the same size and/or shape. For example, in another exemplary embodiment, the first and second bumps 110 and 120 may be respectively located on the top and bottom of each of the sensor electrode 102' while having the same size and shape as the sensor electrode 102'.

Meanwhile, an exemplary embodiment in which both of the first and second bumps 110 and 120 are provided is illustrated in FIGS. 21A to 21C, but exemplary embodiments are not limited thereto. For example, in another exemplary embodiment, the first bumps 110 or the second bumps 120 may be provided on only one surface of the pressure sensor 100.

Figure 22A:
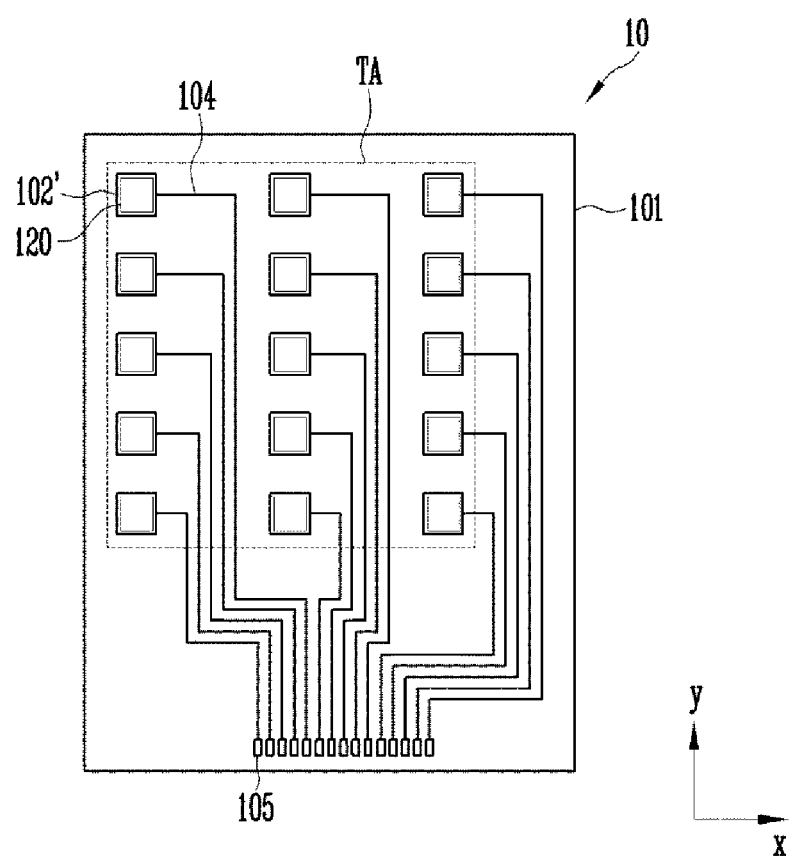
FIGS. 22A, 22B, and 22C illustrate a touch sensor according to an exemplary embodiment.
Figure 22B:
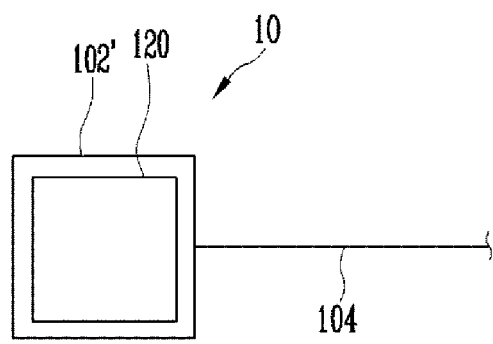
Figure 22C:
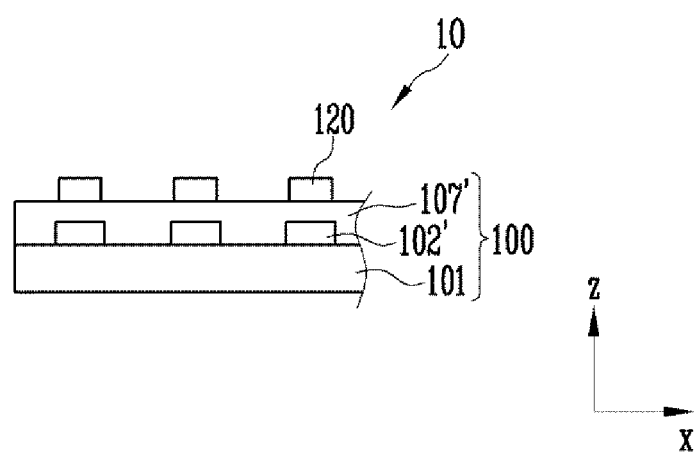

FIGS. 22A to 22C illustrate a touch sensor according to an exemplary embodiment. Specifically, FIGS. 22A to 22C illustrate a modification of the touch sensor shown in FIGS. 21A to 21C. In FIGS. 22A to 22C, components identical to those of the exemplary embodiment of FIGS. 21A to 21C are designated with like reference numerals, and their detailed descriptions will be omitted.

Referring to FIGS. 22A to 22C, the touch sensor 10 according to the exemplary embodiment may include the pressure sensor 100 and the second bumps 120 provided on the upper surface of the pressure sensor 100. In an exemplary embodiment, the second bumps 120 may be provided on the top of the protective layer 107' to overlap with the sensor electrodes 102'.

That is, in some exemplary embodiments, the bump structure is provided only on the upper surface of the pressure sensor 100, and may not be provided on the lower surface of the pressure sensor 100. In this case, although the bump structure is provided, the sensor electrodes 102' can be sufficiently deformed corresponding to a pressure. In an exemplary embodiment, when the sensor electrodes 102' is configured as deformation sensitive devices having a strain gauge structure, a sufficient deformation or displacement sufficient necessary for pressure sensing may occur in the sensor electrodes 102', corresponding to a pressure applied to the touch sensor 10.

FIGS. 23A to 23D each illustrate a bump according to an exemplary embodiment. In particular, FIGS. 23A to 23D illustrate different exemplary embodiments of the shape of the bump.

Figure 23A:
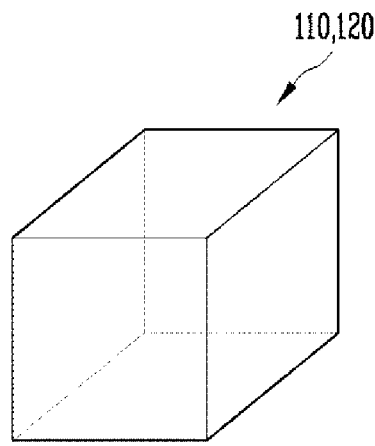
FIGS. 23A, 23B, 23C, 23D each illustrate a bump according to an exemplary embodiment, which illustrate different exemplary embodiments of the shape of the bump.
Figure 23B:
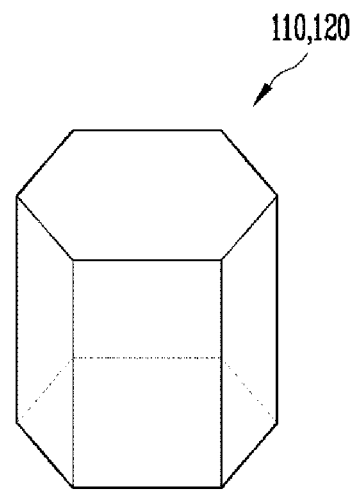

Referring to FIGS. 23A and 23B, in some exemplary embodiments, each bump (a first bump 110 and/or a second bump 120) may have the shape of a polygonal column such as a square column or a hexagonal column.

Figure 23C:
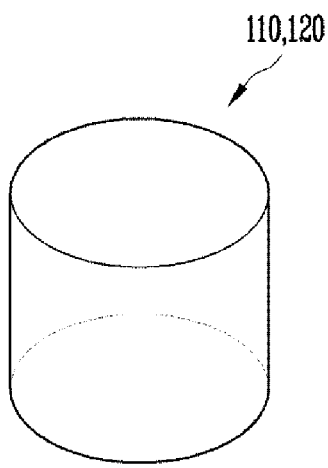
Figure 23D:
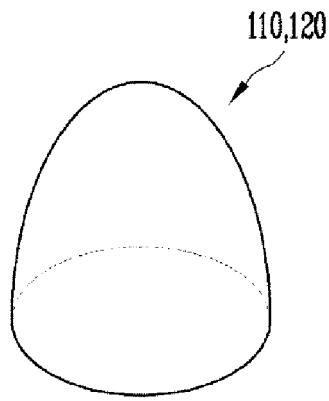

Referring to FIGS. 23C and 23D, in some exemplary embodiments, each bump 110 or 120 may have the shape of a cylinder or have the shape of a hemisphere or dome.

That is, in the present disclosure, the shape of the bumps 110 and 120 is not particularly limited. In addition to the shapes described in the above-described exemplary embodiments, the shape of the bumps 110 and 120 may be variously changed. Also, in some exemplary embodiments, the shape of the first and second sensor electrodes 102 and 103 (particularly, the shape of the intersection portion) or the shape of the island-shaped sensor electrodes 102' may be changed to correspond to that of the bumps 110 and 120.

Figure 24:
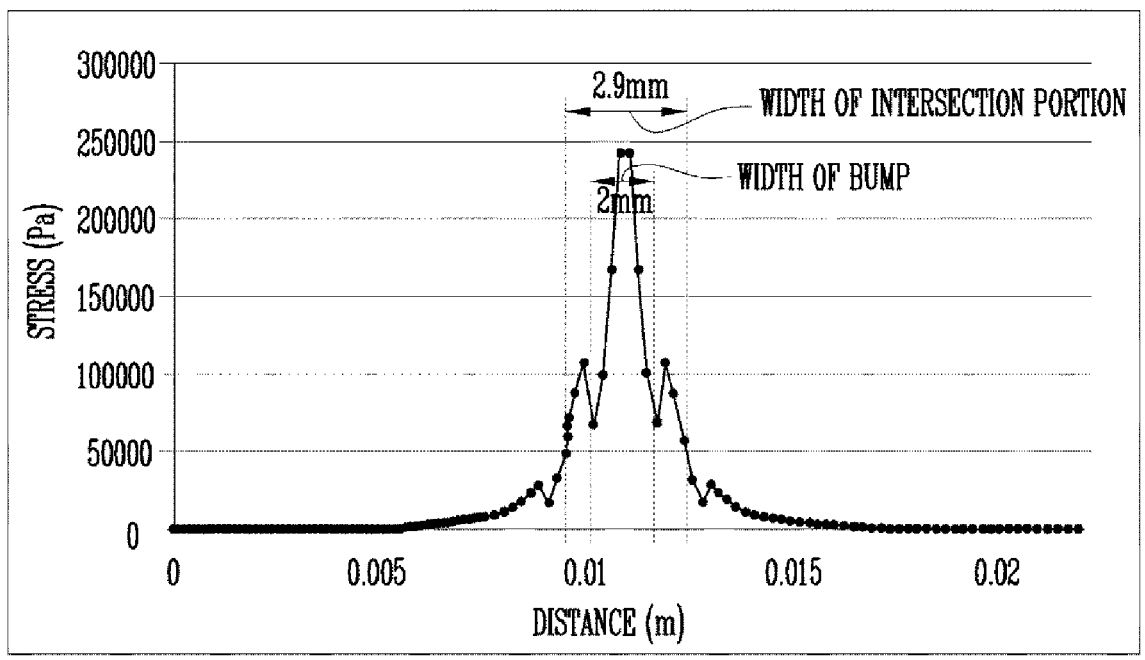
FIG. 24 is a graph illustrating stresses applied to the coordinate point and the periphery thereof when a pressure is applied on a predetermined coordinate point at which at least one bump is disposed.

FIG. 24 is a graph illustrating, when a pressure is applied to a coordinate point at which at least one bump is provided, stresses are applied to the coordinate point and the periphery thereof. For convenience, a case where at least one bump, e.g., a second bump, which has a width smaller than that of any one intersection portion among the intersection portions of the first and second sensor electrodes, is located on the intersection portion is illustrated in FIG. 24. In FIG. 24, in order to clearly indicate the positions of the intersection portion and the bump, the position of a predetermined reference point located at the periphery of the intersection portion is set to zero, and stresses are illustrated according to distances from the reference point.

Referring to FIG. 24, it can be seen that, when a pressure is applied to an intersection portion at which at least one bump (hereinafter, assumed as a second bump 120) is provided, the pressure is concentrated on the region in which the second bump 120 is provided. Thus, at least the second bump 120 is provided on the intersection portion, and the width of the second bump 120 is set by considering both of the mechanical stability and the propagation, so that the sensitivity of the touch sensor 10 can be optimized.

FIGS. 25A to 25C illustrate changes in stress and sensitivity depending on the presence of bumps, positions of the bumps, and a pitch between the bumps. In particular, experimental results obtained by measuring stresses (e.g., average values of stresses) as the same pressure is applied to a predetermined coordinate point located on the touch region TA while changing the presence of bumps, the positions of the bumps, and/or the pitch between the bumps with respect to the coordinate point.

Referring to FIG. 25A, it can be seen that, although the same pressure is applied to the predetermined coordinate point, the magnitude of the stress applied to the coordinate point is changed depending on the presence of bumps. For example, it can be seen that, when one second bump 120 is located on the top of the coordinate point, a large stress is applied under the same pressure as compared with any bump is not located on the coordinate point. In addition, it can be seen that, when one first bump 110 and one second bump 120 are located on the top and bottom of the coordinate point, respectively, a larger stress is applied to the coordinate point. That is, as at least one bump 110 and/or 120 is disposed at each coordinate point on the touch region TA, the effect that the pressure is concentrated on the coordinate point can be obtained. Accordingly, the sensitivity of the touch sensor 10 can be improved.

Referring to FIG. 25B, it can be seen that, although the first bump 110 and the second bump 120 are equally located at each coordinate point on the touch region TA, including the predetermined coordinate point, the magnitude of a stress applied to the coordinate point is changed depending on a pitch between bumps (i.e., a pitch between coordinates points). For example, it can be seen that, when the pitch between bumps is increased from 3 mm to 6 mm, a larger pressure is applied to the coordinate point due to a larger pressure concentration effect. Thus, the sensitivity of the touch sensor 10 can be improved by controlling the pitch between bumps (e.g., an increase in pitch). However, when the pitch between bumps increases, the resolution of the touch sensor 10 may be degraded, and a larger propagation phenomenon may occur. Therefore, the pitch between bumps may be set by considering other factors such as resolution and propagation, in addition to the sensitivity of the touch sensor 10.

Referring to FIG. 25C, even when a bump structure is provided on only one surface of the touch sensor 10, the sensitivity of the touch sensor 10 may be increased according to a change in pitch between bumps. For example, it can be seen that, when the pressure sensor 100 is disposed on the top of a bump bracket as shown in FIG. 18 (i.e., a bump bracket in which a plurality first bumps 110 are integrally connected to each other through lower surfaces (e.g., bottom surfaces) thereof), a glass substrate having, for example, a thickness of 0.33 t is placed on the top of the pressure sensor 100, and a sensitivity is measured at a predetermined coordinate point, the stress applied to the coordinate point increases according to the application of bumps and an increase in pitch between bumps. That is, although a pressure having the same magnitude are applied to the touch sensor 10 from the outside, the magnitude of a stress applied to a corresponding coordinate point may be changed depending on the presence of bumps and a pitch between bumps. Thus, in the exemplary embodiments, when the bump structure is applied to the touch sensor 10 a pressure value that can be sensed (a sensitivity measurement value) is further lowered, and accordingly, the sensitivity of the touch sensor 10 can be further improved.

FIGS. 26 to 35 each illustrate a display device according to an exemplary embodiment. In particular, FIGS. 26 to 35 illustrate various exemplary embodiments related to an arrangement relationship between components, and the like in a display device including a pressure sensor and a bump structure according to an exemplary embodiment. For convenience, sections of display devices according to exemplary embodiments are schematically illustrated in FIGS. 26 to 35. For example, each component of the display device is simplified, such as that only the lower surface (or the rear or bottom surface) of the housing (or first sub-housing) shown in FIGS. 2A to 3 is schematically illustrated.

Figure 26:
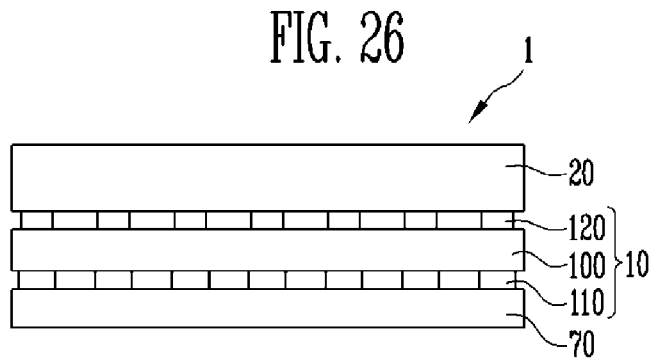
FIGS. 26, 27, 28, 29, 30, 31, 32, 33, 34 and 35 each illustrate a display device according to an exemplary embodiment.

Referring to FIG. 26, the display device 1 according to the exemplary embodiment includes the display panel 20 and the housing 70 that supports and/or accommodates the display panel 20, and further includes the touch sensor 10 provided between the display panel 20 and the housing 70. In some exemplary embodiments, the polarizing layer 30 and/or the window 60, shown in FIGS. 2A to 3, may be further provided on the top of the display panel 20.

In some exemplary embodiments, the touch sensor 10 may include the pressure sensor 100 and a bump structure provided on at least one of the upper and lower surfaces of the pressure sensor 100. In an exemplary embodiment, the bump structure may include a plurality of first bumps 110 provided on the lower surface of the pressure sensor 100 and a plurality of second bumps 120 provided on the upper surface of the pressure sensor 100.

The material constituting the bumps 110 and 120 is not particularly limited. However, when a specific additional function is provided to the bumps 110 and 120, the shape and/or material of the bumps 110 and 120 may be selected to correspond to the function. In an exemplary embodiment, as the second bumps 120 located between the pressure sensor 100 and the display panel 20 are made of a conductive pressure sensitive adhesive including a conductive material such as copper (Cu), the bump structure may be integrally formed with an EMI shielding layer.

Figure 27:
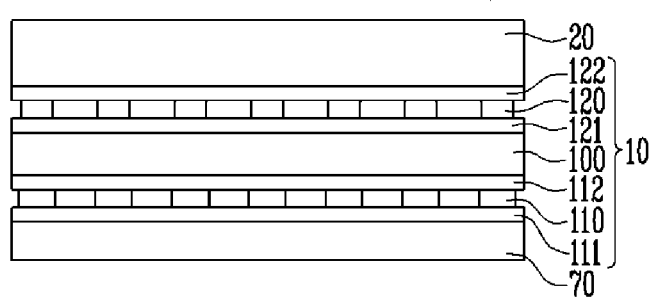

Referring to FIG. 27, in some exemplary embodiments, the adhesive layers 111, 112, 121, and 122 may be provided on at least one surface (e.g., first and/or second surfaces) of the first and/or second bumps 110 and 120. In an exemplary embodiment, the pressure sensitive adhesive layers 111, 112, 121, and 122 may be provided on both surfaces of the first and second bumps 110 and 120.

Figure 28:
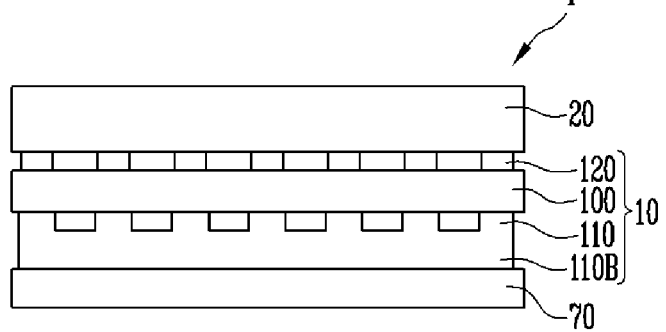

Referring to FIG. 28, in some exemplary embodiments, at least some of the bumps 110 and 120 may be integrally connected to each other. In an exemplary embodiment, lower surfaces of the first bumps 110 may be integrally connected to each other, to constitute a bump bracket (or a bump housing).

Figure 29:
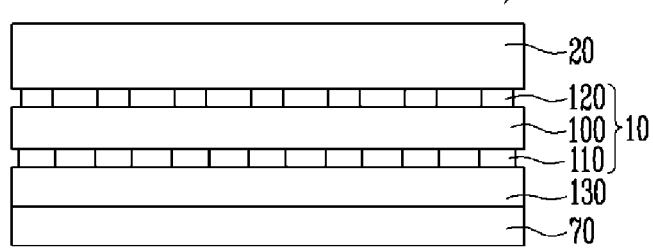

Referring to FIG. 29, in some exemplary embodiments, at least the first bumps 110 may be separated from each other to each be configured as a single bump 110. In this case, a supporting layer 130 such as a high modulus substrate may be provided between the first bumps 110 and the housing 70.

Figure 30:
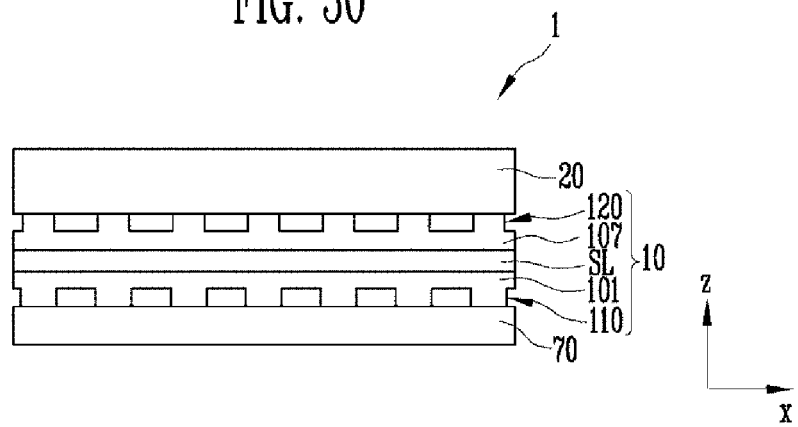

Referring to FIG. 30, in some exemplary embodiments, the first bumps 110 and/or the second bumps 120 may be integrally formed with the first sensor substrate 101 or the second sensor substrate 107. In an exemplary embodiment, the first bumps 110 may be integrally configured with the first sensor substrate 101, and the second bumps 120 may be integrally configured with the second sensor substrate 107 (or the protective layer 107'). For example, the first bumps 110 may protrude in the lower direction (or the rear or bottom direction) in the first sensor substrate 101, and the second bumps 120 may protrude in the upper direction (or the front or top direction) in the second sensor substrate 107.

Figure 31:
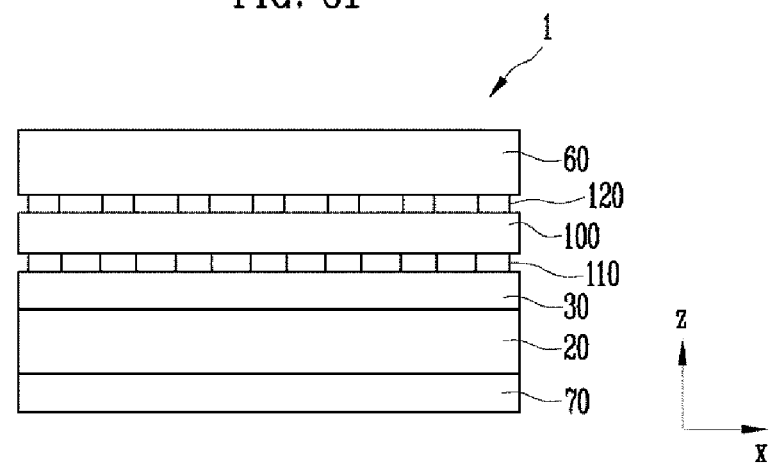

Referring to FIG. 31, in some exemplary embodiments, the pressure sensor 100 may be disposed on the top of the display panel 20. In this case, the pressure sensor 100 may be substantially transparent.

Also, in some exemplary embodiments, the display device 1 may further include at least one of the window 60 provided on the upper surface of the pressure sensor 100 and the polarizing layer provided between the pressure sensor 100 and the display panel 20.

Figure 32:
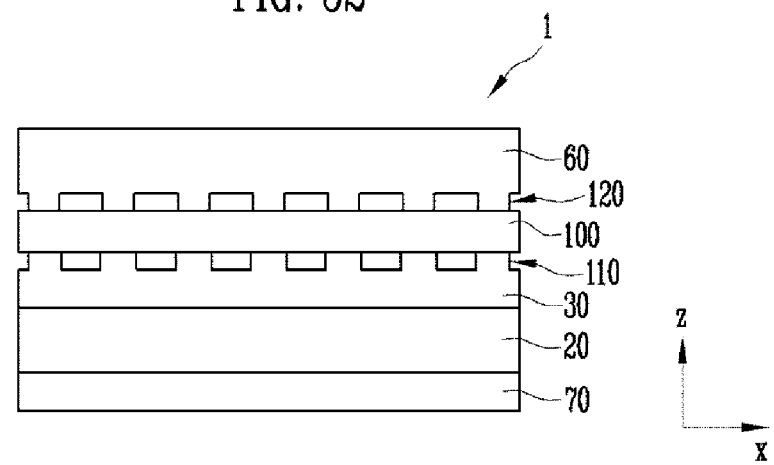

Referring to FIG. 32, at least one of the first and second bumps 110 and 120 may be integrally formed with the polarizing layer 30 or the window 60. For example, the first bumps 110 may be integrally configured with the polarizing layer 30 to be disposed between the pressure sensor 100 and the display panel 20. In an exemplary embodiment, the first bumps 110 may protrude in the thickness direction from a first surface (e.g., an upper, front or top surface) of the polarizing layer 30. That is, the first bumps 110 may be configured by processing, in an uneven shape, one surface of the polarizing layer 30 provided on the top of the display panel 20. In an exemplary embodiment, the second bumps 120 may protrude in the thickness direction from a surface (e.g., a lower, rear or bottom surface) of the window 60. That is, the second bumps 120 may be configured by processing, in an uneven shape, one surface (e.g., the lower, rear or bottom surface) of the window 60 provided on the top of the display panel 20 and the pressure sensor 100.

Figure 33:
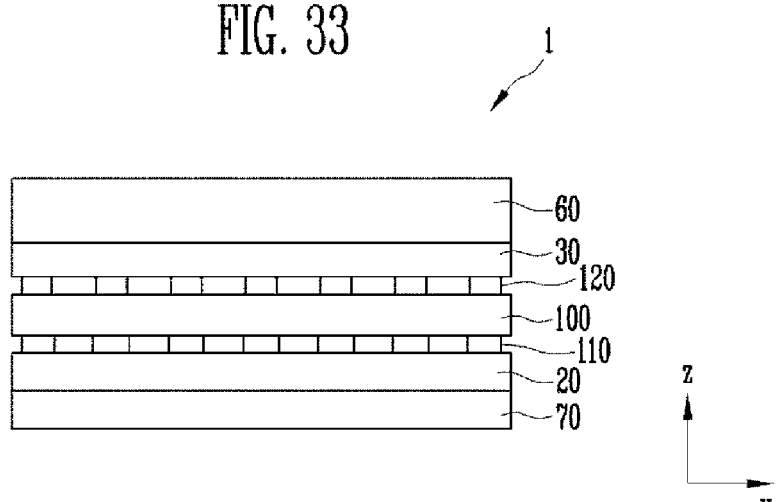

Referring to FIG. 33, in some exemplary embodiments, the pressure sensor 100 may be disposed between the display panel 20 and the polarizing layer 30. In this case, the pressure sensor 100 may be substantially transparent.

Figure 34:
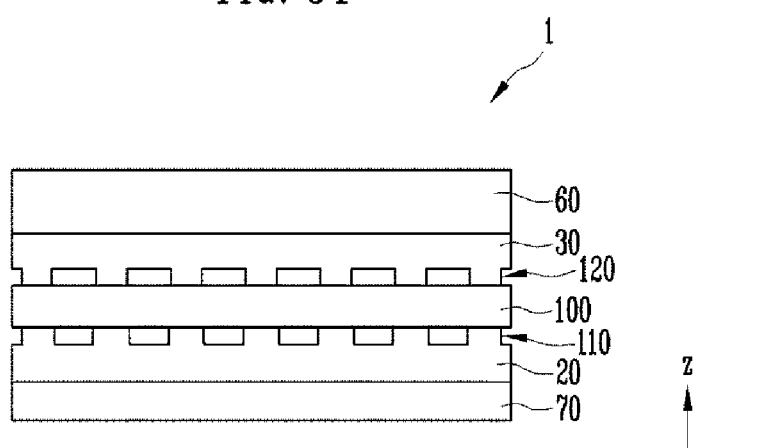

Referring to FIG. 34, in some exemplary embodiments, the first bumps 110 may be integrally configured with the display panel 20, to be disposed between the housing 70 and the pressure sensor 100. In an exemplary embodiment, the first bumps 110 may protrude in the thickness direction from a first surface (e.g., the upper, front, or top surface) of the display panel 20. For example, the first bumps 110 may be configured by processing, in an uneven shape, one surface (e.g., an upper, front, or top surface) of the second display substrate (230 of FIG. 5) included in the display panel 20.

Also, in some exemplary embodiments, the second bumps 120 may be integrally configured with the polarizing layer 30, to be disposed between the pressure sensor 100 and the window 60. In an exemplary embodiment, the second bumps 120 may protrude in the thickness direction from a second surface (e.g., a lower, rear, or bottom surface) of the polarizing layer 30. That is, the second bumps 120 may be configured by processing, in an uneven shape, one surface (e.g., the lower, rear, or bottom surface) of the polarizing layer 30 provided on the top of the pressure sensor 100.

Figure 35:
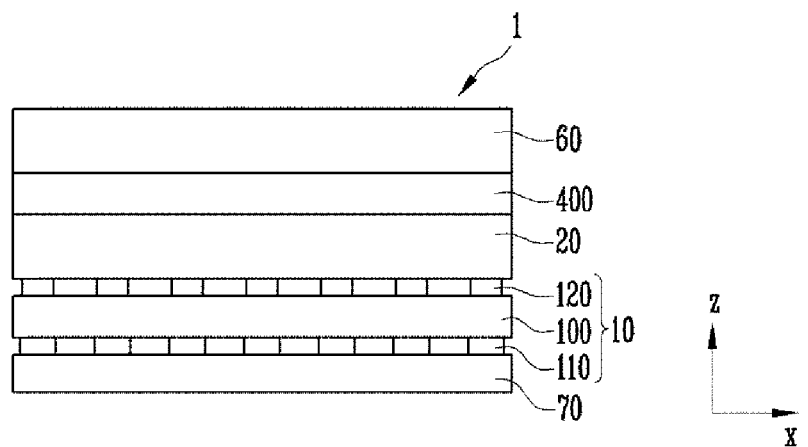

Referring to FIG. 35, in some exemplary embodiments, the display device 1 may include a plurality of touch sensors 10 and 400. In an exemplary embodiment, the display device may include first and second touch sensors 10 and 400 separated from each other with at least the display panel 20 interposed therebetween. In an exemplary embodiment, the first touch sensor 10 may be disposed on the bottom of the display panel 20, i.e., between the display panel 20 and the housing 70. In addition, the second touch sensor 400 may be disposed on the top of the display panel 20. In an exemplary embodiment, the second touch sensor 400 may be disposed between the display panel 20 and the window 60.

In some exemplary embodiments, the first touch sensor 10 may be the touch sensor described in the above-described exemplary embodiment. That is, the first touch sensor 10 may be a touch sensor configured to include the pressure sensor 100 and the bump structure (i.e., the first bumps 110 and/or the second bumps 120).

The second touch sensor 400 may include various types and structures of touch sensors currently known in the art. In an exemplary embodiment, the second touch sensor 400 may be a mutual or self-capacitive type touch sensor, a resistive type touch sensor, an infrared beam type touch sensor, a surface acoustic wave type touch sensor, an integral strain gauge type touch sensor, or a piezo type touch sensor. That is, in the present disclosure, the type or structure of the second touch sensor 400 is not particularly limited.

As described above, the display device 1 including the first and second touch sensors 10 and 400 can detect a touch input with high sensitivity under various environments or conditions. Further, the display device 1 can provide more various functions by using the plurality of touch sensors 10 and 400.

Meanwhile, in some exemplary embodiments, the positions of the first touch sensor 10 and the second touch sensor 400 may be changed. For example, in another exemplary embodiment, the first touch sensor 10 may be provided on the top of the display panel 20, and the second touch sensor 400 may be disposed on the bottom of the display panel 20.

As described above, according to the exemplary embodiment, a bump structure is provided on at least one surface of the pressure sensor 100, so that a touch pressure can be sensed with high sensitivity. In some exemplary embodiments, when a pressure is applied from the outside, the bump structure concentrates the pressure on an effective point (i.e., a corresponding coordinate point) of the pressure sensor 100, thereby improving the sensitivity of the pressure sensor 100. According to the present disclosure, a touch pressure along with a touch position can be effectively detected through one pressure sensor 100.

If the touch pressure along with the touch position is sensed as described above, it is possible to implement various user interfaces (UIs) and various user experiences (UXs). For example, a specific function such as pop-up or zoom-in may be set to be performed through pressure sensing, or various functions may be provided to a user through execution of a specific application.

In addition, according to kinds of the pressure sensor 100, the pressure sensor 100 may sense a pressure with high sensitivity even when a user uses the display device 1 in water or while wearing gloves. Thus, the display device 1 can be conveniently used even during water leisure or underwater shooting.

In the touch sensor and the display device including the touch sensor according to the present disclosure, a pressure sensor is provided to sense a position and a pressure of a touch input. Particularly, in the touch sensor and the display device including the touch sensor according to the present disclosure, a bump structure is provided on at least one surface of the pressure sensor, so that a touch pressure can be sensed with high sensitivity.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a plurality of pixels disposed in a display region;
   a pressure sensor disposed to overlap with the display panel, the pressure sensor comprising a plurality of sensor electrodes disposed in a touch region;
   a bump structure disposed directly on each of a first outer surface and a second outer surface of the pressure sensor to be separated from the plurality of sensor electrodes; and
   a housing supporting the display panel, the pressure sensor, and the bump structure, wherein the bump structure comprises a plurality of bumps distributed on respective coordinate points of a plane at which the plurality of sensor electrodes are disposed, the bump structure comprising a plurality of first bumps on the respective coordinate points of the second outer surface of the pressure sensor and a plurality of second bumps on the respective coordinate points of the first outer surface of the pressure sensor to overlap with the first bumps with the plurality of sensor electrodes interposed therebetween, and wherein the first bumps have a same physical shape as the second bumps, wherein the pressure sensor and the bump structure are disposed between the display panel and the housing, wherein the housing includes a stepped part configured to support at least a portion of the display panel.

2. The display device of claim 1, wherein the plurality of first bumps are disposed to be separated from each other, and the display device further comprises a supporting layer disposed between the plurality of first bumps and the housing.

3. The display device of claim 1, wherein at least one of the plurality of first bumps and the plurality of second bumps are made of a conductive material.

4. The display device of claim 1, wherein the pressure sensor comprises at least one of an elastic layer, a piezoelectric layer, a pressure sensitive layer, and a deformation sensitive layer, wherein the plurality of sensor electrodes includes a first sensor electrode and a second sensor electrode separated from each other by way of the elastic layer provided therebetween.

\* \* \* \* \*